United States Patent
Komatsu et al.

(10) Patent No.: US 7,394,416 B2
(45) Date of Patent: Jul. 1, 2008

(54) ANALOG-DIGITAL CONVERTER

(75) Inventors: Shigeyuki Komatsu, Kyoto (JP); Ichiro Yamane, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/583,848

(22) Filed: Oct. 20, 2006

(65) Prior Publication Data

US 2007/0090986 A1    Apr. 26, 2007

(30) Foreign Application Priority Data

Oct. 21, 2005    (JP) .............................. 2005-306928

(51) Int. Cl.
*H03M 1/00*    (2006.01)
(52) U.S. Cl. ....................... 341/136; 341/155
(58) Field of Classification Search ................. 341/155, 341/136, 133, 122, 156, 139
See application file for complete search history.

(56) References Cited

U.S. PATENT DOCUMENTS

| | | | |
|---|---|---|---|
| 6,166,367 A | 12/2000 | Cho | |
| 6,166,671 A * | 12/2000 | Kitagawa et al. | 341/139 |
| 6,567,024 B1 * | 5/2003 | Ishikawa | 341/136 |
| 6,577,263 B2 * | 6/2003 | Saito | 341/155 |
| 6,734,817 B2 * | 5/2004 | Naka et al. | 341/155 |
| 6,737,698 B1 | 5/2004 | Paul et al. | |
| 6,747,307 B1 | 6/2004 | Vathulya et al. | |
| 6,797,932 B2 | 9/2004 | Takahashi et al. | |
| 2002/0008653 A1 * | 1/2002 | Nishimura | 341/154 |

FOREIGN PATENT DOCUMENTS

| | | |
|---|---|---|
| JP | 61-263251 A | 11/1986 |
| JP | 4-268756 A | 9/1992 |
| JP | 2700959 | 10/1997 |
| JP | 2001-285724 | 10/2001 |

* cited by examiner

*Primary Examiner*—Jean B Jeanglaude
(74) *Attorney, Agent, or Firm*—McDermott Will & Emery LLP

(57) ABSTRACT

An analog-digital converter includes an analog switch on a semiconductor substrate, the analog switch having a P-channel transistor and an N-channel transistor; and a capacitive element having a first electrode and a second electrode. The first electrode and the second electrode are formed in a region in a layer different from a layer of the analog switch, the region extending over the analog switch. The first electrode and the second electrode have a comb-shaped pattern different from an arrangement pattern of the source regions and the drain regions of the P-channel transistor and the N-channel transistor.

14 Claims, 23 Drawing Sheets

(cross section at A-A)

(cross section at B-B)

(cross section at D-D)

(cross section at E-E)

(cross section at G-G)

(cross section at I-I)

(cross section at J-J)

(cross section at M-M)

(cross section at L-L)

(cross section at N-N)

(cross section at O-O)

ANALOG-DIGITAL CONVERTER

BACKGROUND OF THE INVENTION

1. Field of the Invention

The present invention relates to an analog-digital converter for converting an analog signal to a digital signal.

2. Description of the Prior Art

The technique of forming lines adjacent to each other within one interconnect layer and using fringing capacitance between these lines has been known in order to obtain large capacitance while decreasing an area consumed by a capacitor over a semiconductor substrate (see, for example, Japanese Laid-Open Patent Publication No. 61-263251 and Japanese Patent No. 2700959).

An analog-digital converter including the above-mentioned capacitor has a capacitor array block 902 in which unit capacitors 901 having a predetermined capacitance are densely situated in the row and column direction as shown in, for example, FIG. 1. The capacitor array block 902 is surrounded by a dummy capacitor 903 in order to reduce variations in the capacitance of each unit capacitor 901.

The unit capacitors 901 are organized into groups, which consist of predetermined numbers (for example 16, 8, 4, 2, and 1) of unit capacitors 901, and these groups of unit capacitors 901 are respectively connected to corresponding discrete lines (16C_Lin, 8C_Lin, 4C_Lin, 2C_Lin, and 1C_Lin_a to 1C_Lin_f) at the electrodes on one side. Each discrete line is connected to an analog switch 904a in a voltage switching circuit 904 situated near the capacitor array block 902. Predetermined reference voltages, the predetermined reference voltages divided by an R-2R resistance array 905, or analog input voltages are selectively applied to each discrete line.

The unit capacitors 901 are connected to a comparator 906 via a common line (com_Lin) at the electrodes on the other side. An output of the comparator 906 is input to a control circuit 907 and converted to, for example, 10-bit digital values D0-D9.

As an example of other techniques for a circuit having a transistor and a capacitor, a technique has been known in which a line having the same pattern as each of electrodes is aligned over each of the electrodes so as to form a capacitor to be connected between a source region and a drain region, such as a transistor of a power amplifier (see the specification of U.S. Pat. No. 6,747,307).

In the above-mentioned analog-digital converter having the voltage switching circuit 904 situated near the capacitor array block 902, the fringing capacitance is advantageously used, so that it is possible to decrease the area consumed by the capacitor array block 902. However, it is not possible for the above-mentioned analog-digital converter to reduce an area consumed by the voltage switching circuit 904. Therefore, overall area miniaturization of the analog-digital converter is difficult.

The groups of the unit capacitors 901 have different discrete line layouts. Beside that, it is difficult to avoid (i) crossovers of discrete lines and (ii) crossovers of discrete lines and the common line. For these reasons, it difficult to achieve high accuracy in relative capacitance ratio in each group and to decrease effects of cross-talk. Therefore, obtaining a highly accurate analog-digital converter is difficult.

Moreover, in the arrangement in which the capacitor is formed by aligning lines over the source region and over the drain region of the transistor, it is not possible to arbitrary select a polarity of transistor and design a connection relationship between the transistor and the capacitor. Moreover, the position of each electrode is determined by the size or shape of the transistor. Therefore, desired capacitance is not necessarily obtained.

SUMMARY OF THE INVENTION

In view of the above-mentioned problems, an object of the present invention is to reduce an area consumed by an analog-digital converter over a semiconductor substrate. Another object of the invention is to easily realize a highly accurate analog-digital converter.

To achieve the above-mentioned objects, an analog-digital converter according to the present invention comprises:

an analog switch on a semiconductor substrate, the analog switch having a P-channel transistor and an N-channel transistor; and a capacitive element having a first electrode and a second electrode, wherein a source region of the P-channel transistor is connected to a drain region of the N-channel transistor, a source region of the N-channel transistor is connected to a drain region of the P-channel transistor, and the first electrode of the capacitive element is connected to one of connected portions of the regions, and the first electrode and the second electrode are included in a region in a layer different from a layer of the analog switch, the region extending over the analog switch, and the first electrode and the second electrode have a comb-shaped pattern different from an arrangement pattern of the source regions and the drain regions of the P-channel transistor and the N-channel transistor.

As described above, the capacitive element is formed in a region in a layer different from a layer of the analog switch, the region extending over the analog switch. This enables an easy reduction of the area required for the formation of the analog switch and the capacitive element. Moreover, it is possible to easily connect the analog switch and the capacitive element at a short distance. Consequently, occurrences of parasitic capacitance and cross talk are suppressed, and errors in the capacitance ratio and effects of noise are reduced. Therefore, it is possible to easily perform a highly accurate analog-digital conversion.

DESCRIPTION OF THE PREFERRED EMBODIMENTS

Figure 1:
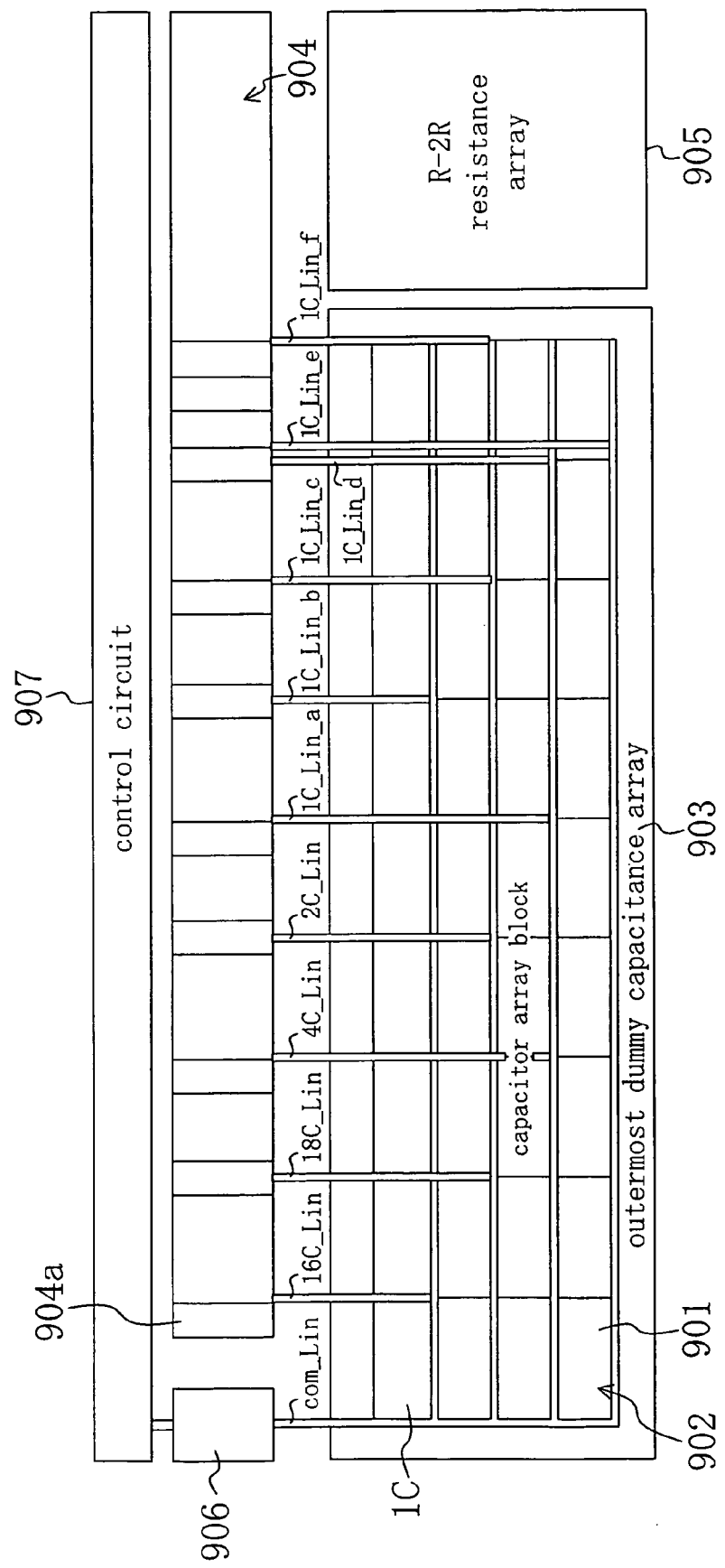
FIG. 1 is a plan view illustrating a circuit array of a conventional analog-digital converter.

Embodiments according to the present invention will be described in detail below with reference to accompanying drawings. Note that, in each of the following embodiments, like elements to those of any other embodiments will be denoted by like reference numerals, and will not be described repeatedly.

Embodiment 1

(Circuitry)

Figure 2:
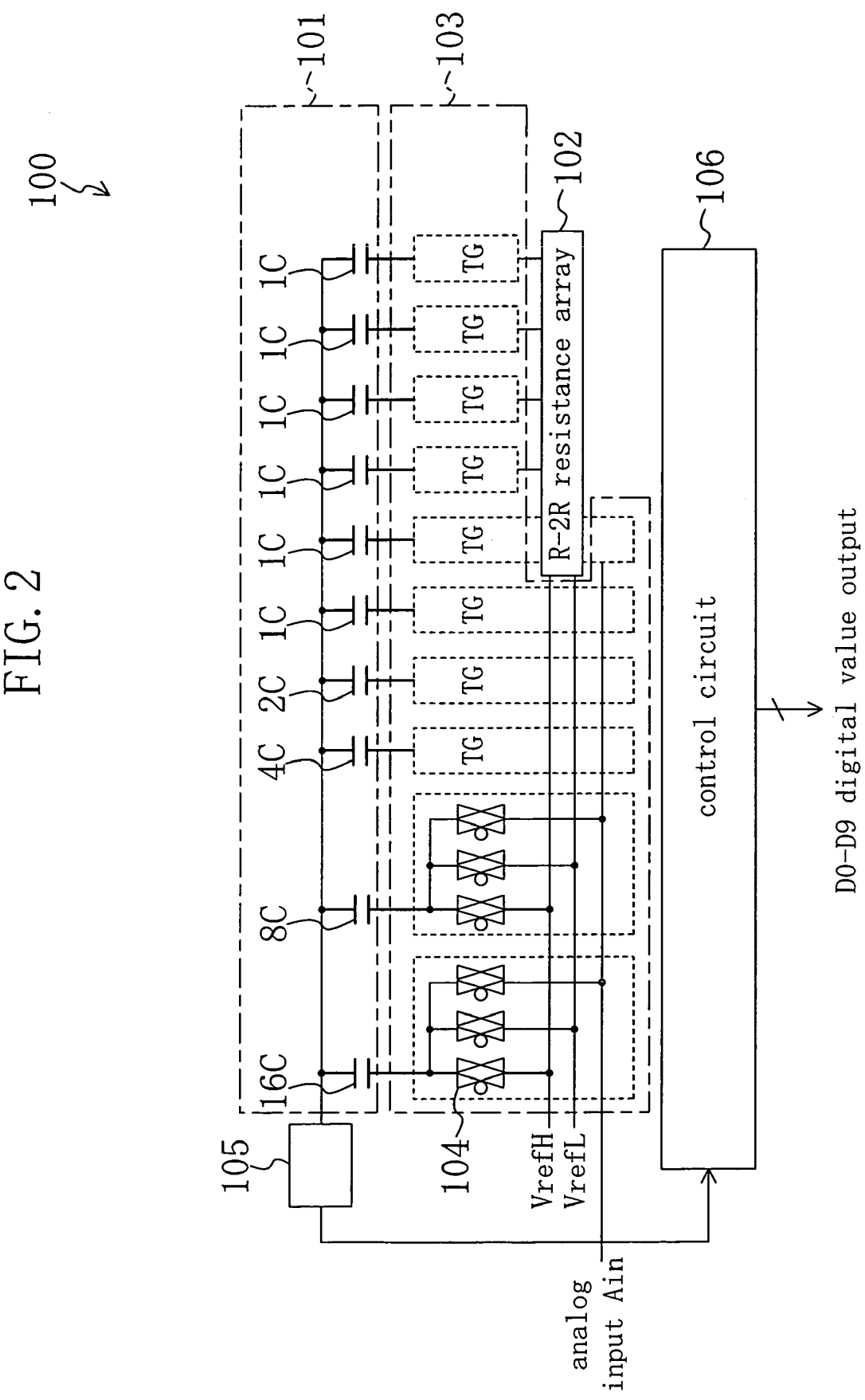
FIG. 2 is a circuit diagram illustrating a circuit configuration of an analog-digital converter according to Embodiment 1.

For an example of a 10-bit successive-approximation analog-digital converter according to Embodiment 1, a circuitry of an analog-digital converter 100 is first explained with reference to FIG. 2. This analog-digital converter 100 is provided with a capacitance array block 101 including capacitors 16C, 8C, 4C, 2C, and 1C having a capacitance ratio of 16:8:4:2:1. (Six capacitors 1C are provided and five of the six capacitors 1C serve as capacitances having capacitance ratios of 1/2, 1/4, 1/8, 1/16, and 1/32 by using an R-2R resistance array 102.)

The capacitors are connected to, for example, three analog switches 104 each provided in an analog switch group 103 at the electrodes on one side. These analog switches 104 selectively apply to each capacitor a high potential reference voltage VrefH, a low potential reference voltage VrefL, the high potential reference voltage VrefH and the low potential reference voltage VrefL divided by an R-2R resistance array 102, analog input voltages Ain, or the like.

The capacitors are connected together to a comparator 105 at the electrodes on the other side. An output of the comparator 105 is converted in a control circuit 106 to 10-bit digital values D0-D9.

(Capacitor Structure)

Each capacitor mentioned above includes one or more unit capacitors 201 as shown in FIGS. 3-7. Each unit capacitor 201 is formed by providing first to third metal interconnect layers (M1 layer 300-M3 layer 500) of, for example, aluminum on a semiconductor substrate 200 provided with analog switches 104.

Figure 3:
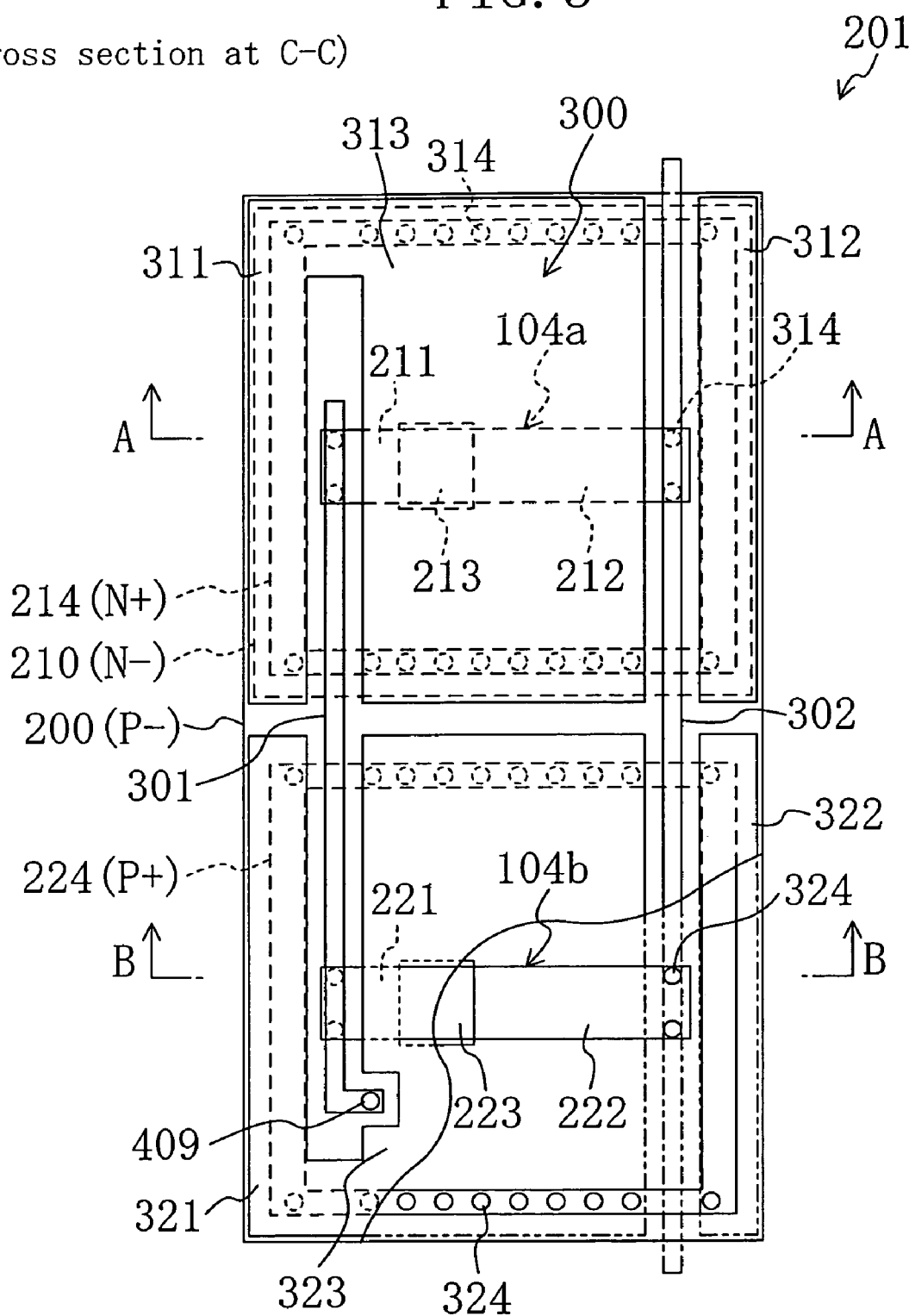
FIG. 3 is a horizontal cross-section illustrating a configuration of a unit capacitor according to Embodiment 1.

As shown in FIG. 3, the semiconductor substrate 200 is formed of P⁻ type semiconductor. A P-channel transistor 104a and an N-channel transistor 104b are formed. The P-channel transistor 104a and the N-channel transistor 104b constitute an analog switch 104. More specifically, an N-well 210 is formed in the semiconductor substrate 200 and in the N-well 210, P⁺ regions 211 and 212 (source and drain) and a polysilicon gate 213 are formed so as to form the P-channel transistor 104a. Likewise, in the semiconductor substrate 200, N⁺ regions 221 and 222 (source and drain) and a polysilicon gate 223 are directly formed so as to form the N-channel transistor 104b. The transistors 104a and 104b are respectively surrounded by an N⁺ diffusion layer 214 and a P⁺ diffusion layer 224 (guard bands).

As shown in FIG. 3, the M1 layer 300 includes switch lines 301 and 302. The switch line 301 connects the P⁺ region 211 of the transistor 104a with the N⁺ region 221 of the transistor 104b. The switch line 302 connects the P⁺ region 212 of the transistor 104a with the N⁺ region 222 of the transistor 104b, and further connects a circuit provided outside the unit capacitor 201. Power supply lines 311 and 312 (guard bands) connecting the N⁺ diffusion layer 214 to a high potential source and power supply lines 321 and 322 (guard bands) connecting the P⁺ diffusion layer 224 to a low potential source are further formed. Further, shields 313 and 323 covering the transistor 104a and 104b are formed as an integral part of the power supply lines 311 and 312.

The switch line 301 and the source and drain regions of the transistors 104a and 104b; the switch line 302 and the source and drain regions of the transistors 104a and 104b; the power supply lines 311 and 312, the shield 313, and the N⁺ diffusion layer 214; and the power supply lines 321 and 322, the shield 323, and the P⁺ diffusion layer 224 are each connected via contacts 314 and 324.

Figure 6:
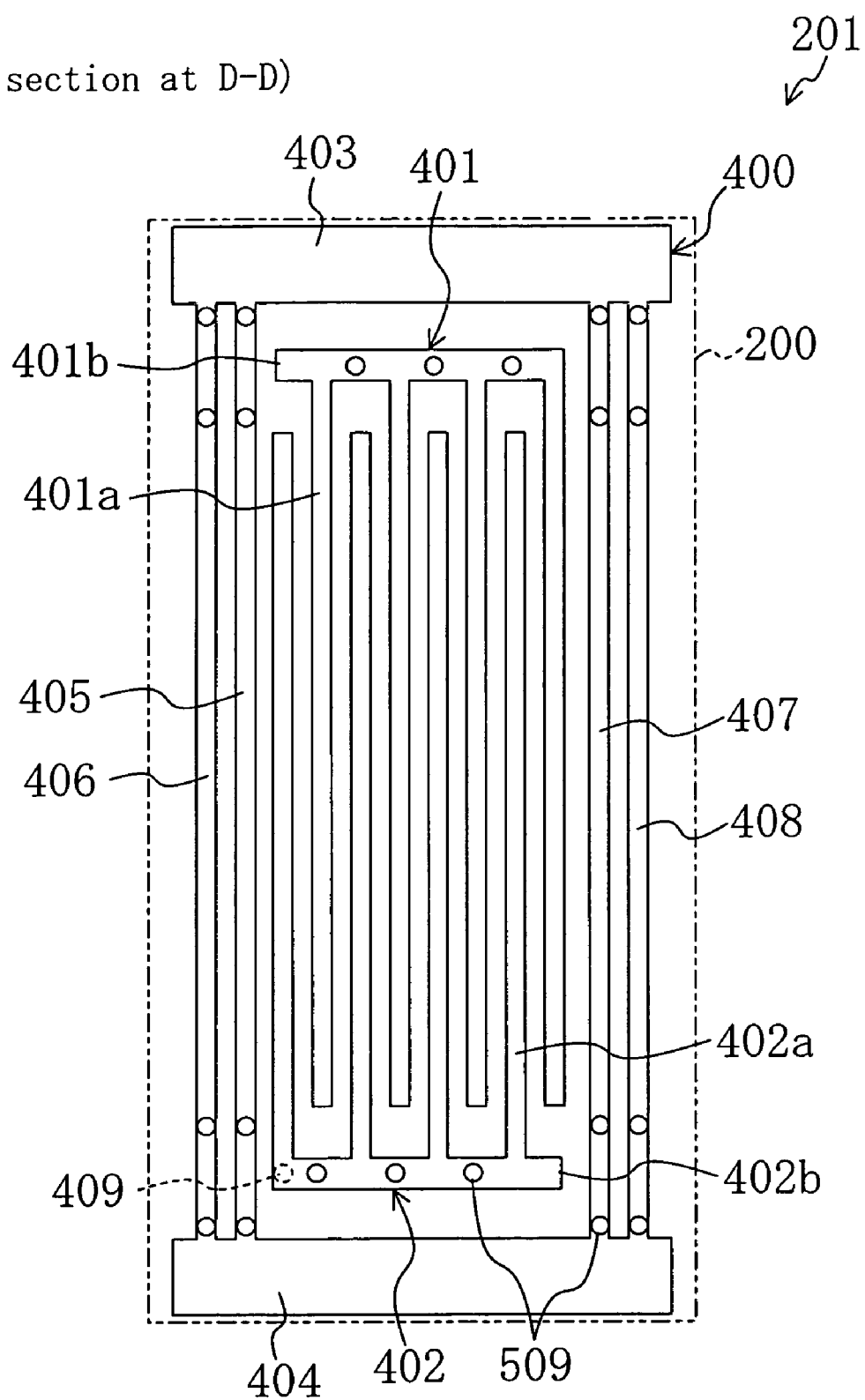
FIG. 6 is another horizontal cross-section illustrating the unit capacitor according to Embodiment 1.

As shown in FIG. 6, the M2 layer 400 includes a pair of comb-shaped electrodes 401 and 402 which has capacitance. The comb-shaped electrodes 401 and 402 respectively have parallel portions 401a and 402a and connection portions 401b and 402b. The one comb-shaped electrode 402 is connected to the switch line 301 of the M1 layer 300 via a contact 409.

Around the comb-shaped electrodes 401 and 402, shields 403-408 (guard bands) are formed to suppress cross talk to the other unit capacitors 201. The shields 403-408 are to be connected to either a high potential source or a low potential source. In order to reduce etching variations in the comb-shaped electrodes 401 and 402 in a manufacturing process, the shields 405-408 (dummy lines) preferably have the same line width and pitch as the comb-shaped electrodes 401 and 402. However, the present invention is not limited to this. Positioning the shields 405 and 407, instead of the comb-shaped electrodes 401 and 402 as described above on a region extending over the switch lines 301 and 302 of the M1 layer 300 enables to reduce a parasitic capacitance between the switch line 301 and the comb-shaped electrode 401 or the switch line 302 and the comb-shaped electrode 402.

Figure 7:
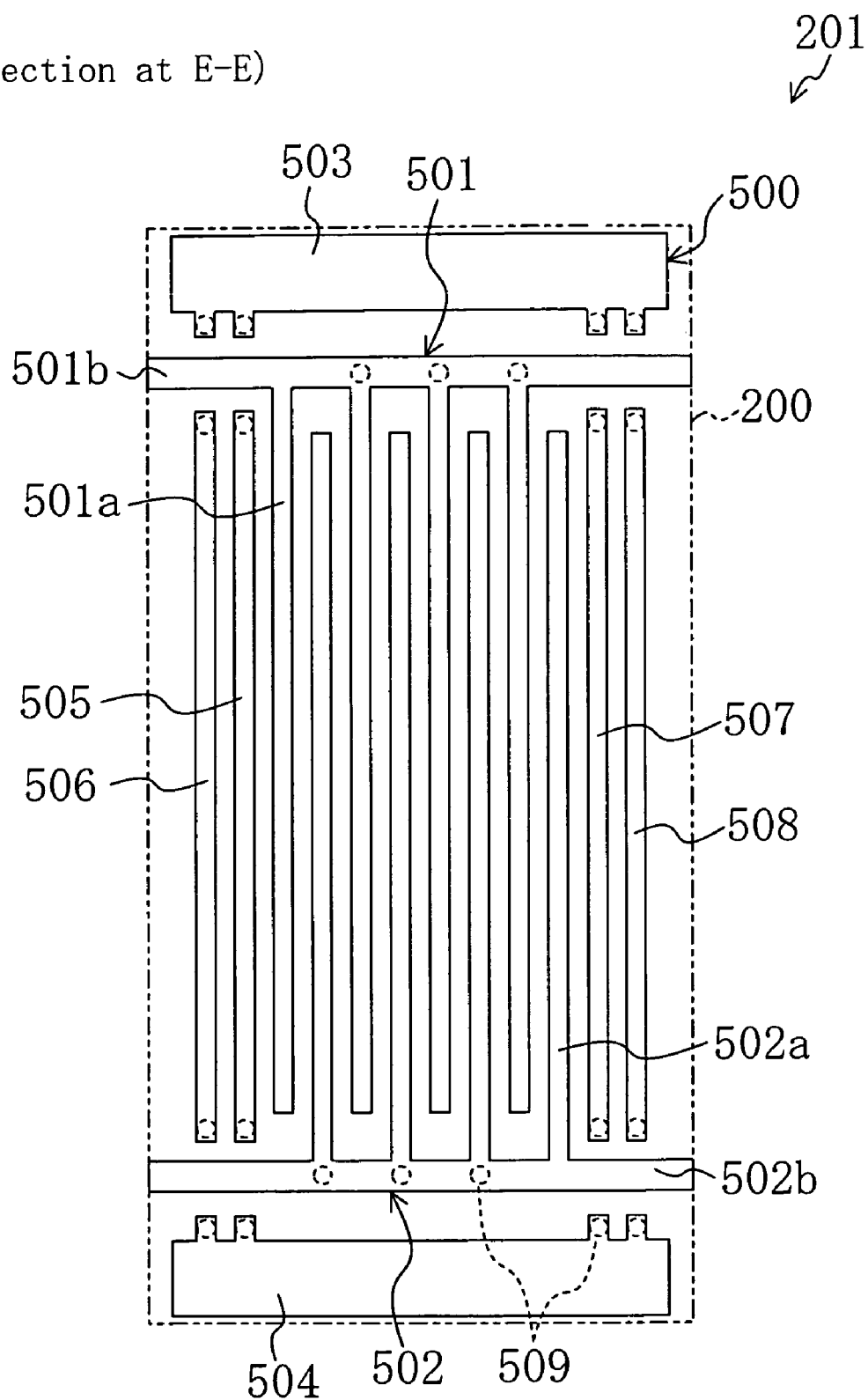
FIG. 7 is still another horizontal cross-section illustrating the unit capacitor according to Embodiment 1.

Similar to the M2 layer 400, the M3 layer 500 includes comb-shaped electrodes 501 and 502 having parallel portions 501a and 502a and connection portions 501b and 502b, and shields 503-508 (guard bands) as shown in FIG. 7. The comb-shaped electrodes 501 and 502 and the shields 503-808 are respectively connected to the comb-shaped electrodes 401 and 402 and the shields 403-408 of the M2 layer 400 via contacts 509. In this case, the comb-shaped electrode 501 extending over the comb-shaped electrode 402 and the comb-shaped electrode 502 extending over the comb-shaped electrode 401 have capacitance also in a direction vertical to the semiconductor substrate 200. Moreover, the connection portions 501b and 502b extended to a periphery of the unit capacitor 201 enable easy coupling with the connection portions 501b and 502b which are situated adjacently to other unit capacitors 201.

(Layout of Unit Capacitor 201 and Relevant Components)

Figure 8:
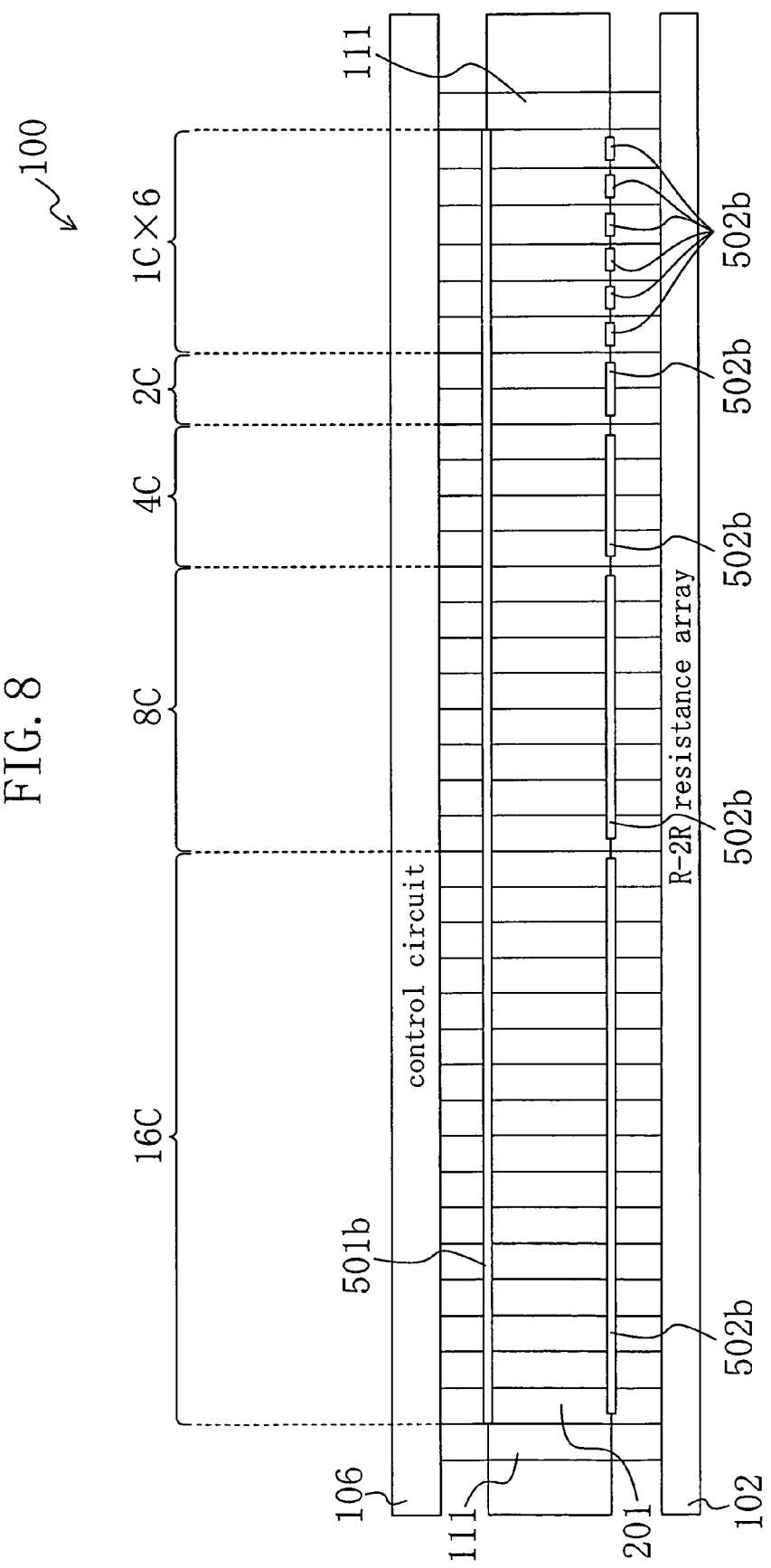
FIG. 8 is a plan view illustrating a circuit array of the analog-digital converter according to Embodiment 1.

Next, referring to FIG. 8, a layout example is explained for an array of the unit capacitor 201 formed as described above, the comparator 105, the control circuit 106, and relevant components on the semiconductor substrate.

A total of 36 unit capacitors 201 are aligned adjacent to each other in one direction between dummy line regions 111. These unit capacitors 201 are connected with each other in order to organize groups consisting of 16, 8, 4, and 2 unit capacitors 201, the groups forming capacitors 16C, 8C, 4C, and 2C (the order of array of these capacitors is not limited to this). More specifically, the connection portions 501b of the comb-shaped electrodes 501 of all unit capacitors 201 are connected with each other and used as a common line (com_Lin), while the connection portions 502b of the comb-shaped electrodes 502 of the unit capacitors 201 within each group are connected with each other.

As described so far, a capacitor is formed in such a manner that the comb-shaped electrodes 401, 402, 501, and 502 are formed in a region in a layer different from a layer of the transistor 104a and 104b, the region extending over the transistors 104a and 104b. This enables an easy reduction of an area required for forming the capacitor and an analog switch. Moreover, it is possible to connect source regions or drain regions of the transistors 104a and 104b to the comb-shaped electrodes 402 and 502 via contacts 409 and 509 at a very short distance (for example, the minimum distance). Consequently, occurrences of parasitic capacitance and cross talk are suppressed and errors in the capacitance ratio and effects of noise are reduced. Therefore, it is possible to easily perform a highly accurate analog-digital conversion.

Moreover, as described so far, the shields 313 and 323 of the M1 layer 300 between the transistors 104a, 104b and the comb-shaped electrodes 401, 402 enable an easy reduction in effects of the switching noise of the transistors 104a and 104b.

In a case where the shields 313 and 323 are formed in a planar form, it is easy to maintain high layout accuracy of, for example, the comb-shaped electrodes 401 and 402. In this case also, it is possible to easily increase analog-digital conversion accuracy. Further miniaturization of an interconnection pattern is also facilitated. Note that, a form of the shields 313 and 323 is not limited to the planar form. The shields 313 and 323 may have the same line width and pitch as, for example, the parallel portion 401a of the comb-shaped electrode 401, such as shields 313' and 323' shown in FIG. 9 and FIG. 10.

Embodiment 2

Figure 11:
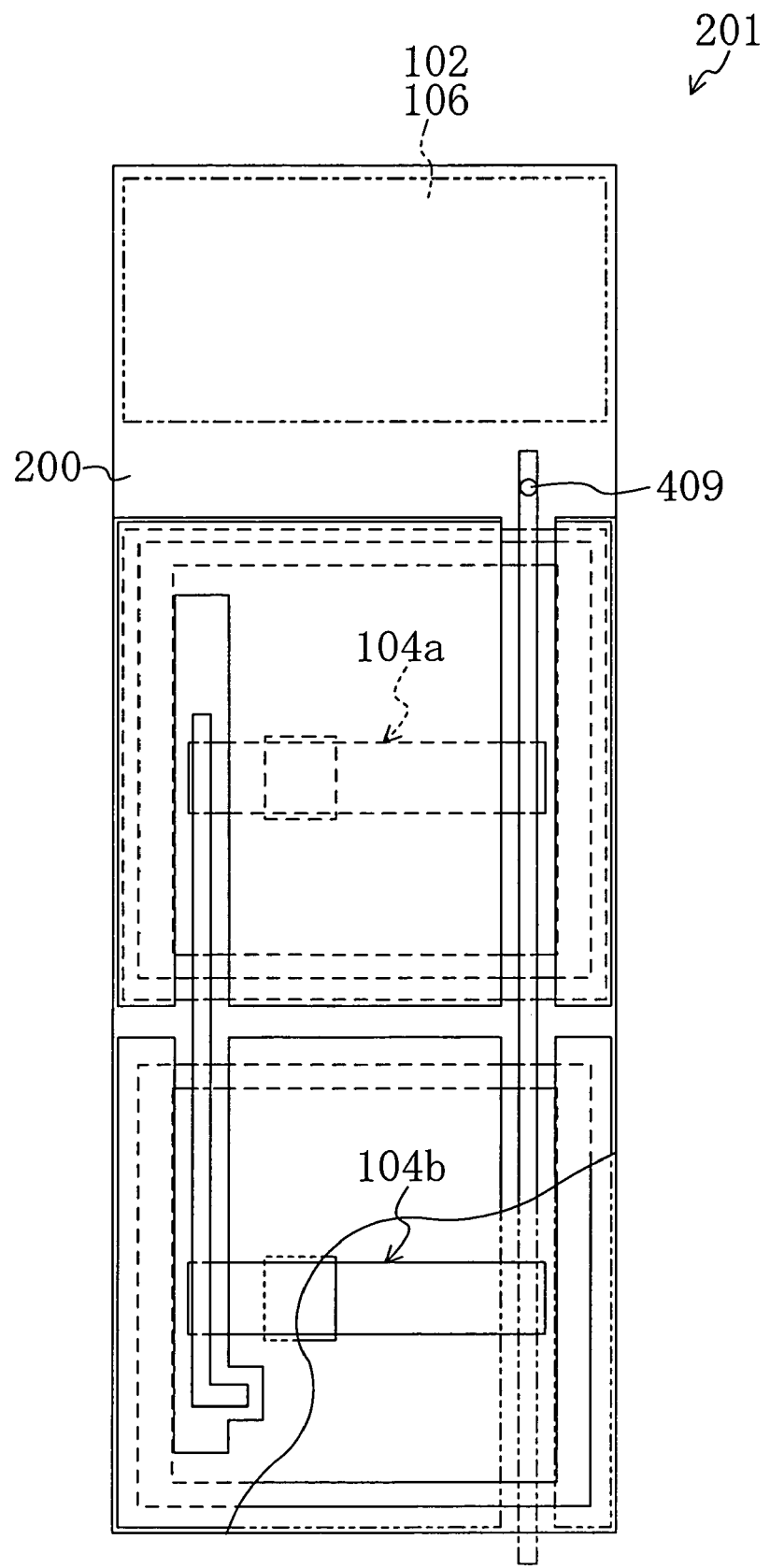
FIG. 11 is a horizontal cross-section illustrating a configuration of a unit capacitor according to Embodiment 2.
Figure 12:
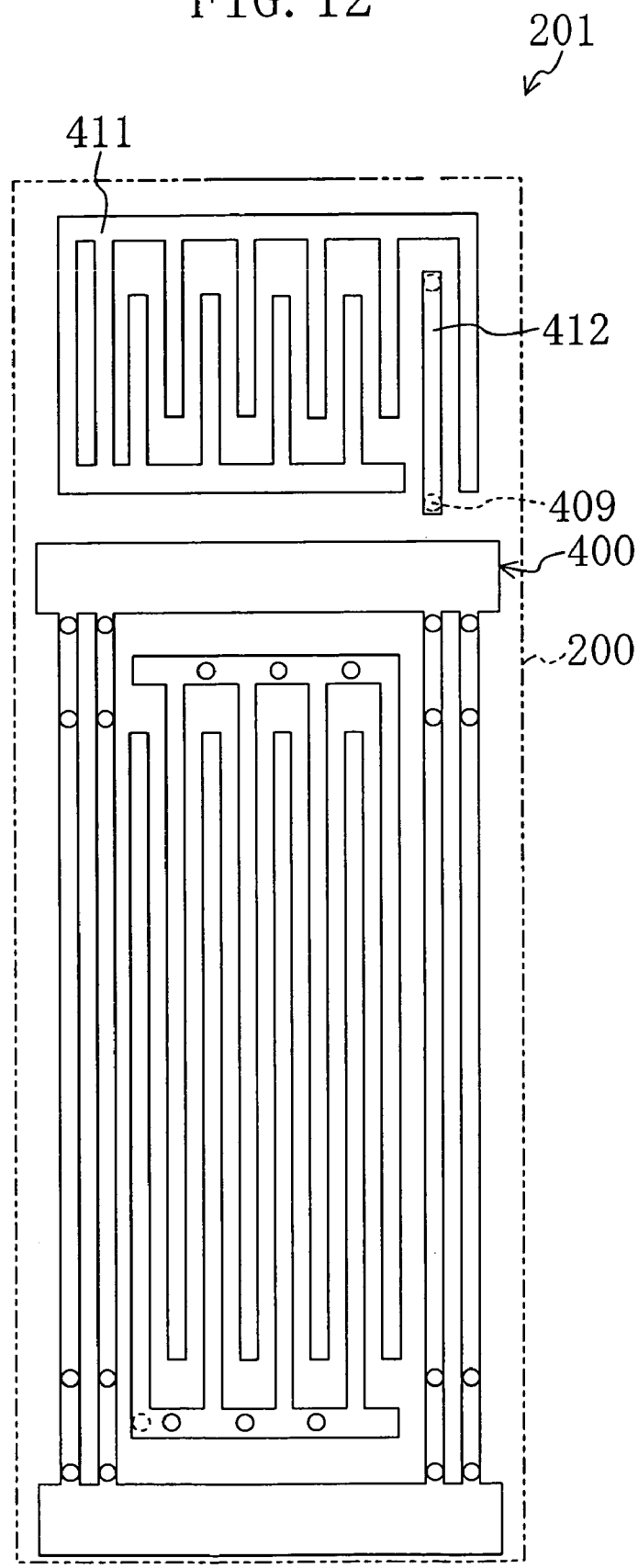
FIG. 12 is another horizontal cross-section illustrating the unit capacitor according to Embodiment 2.
Figure 13:
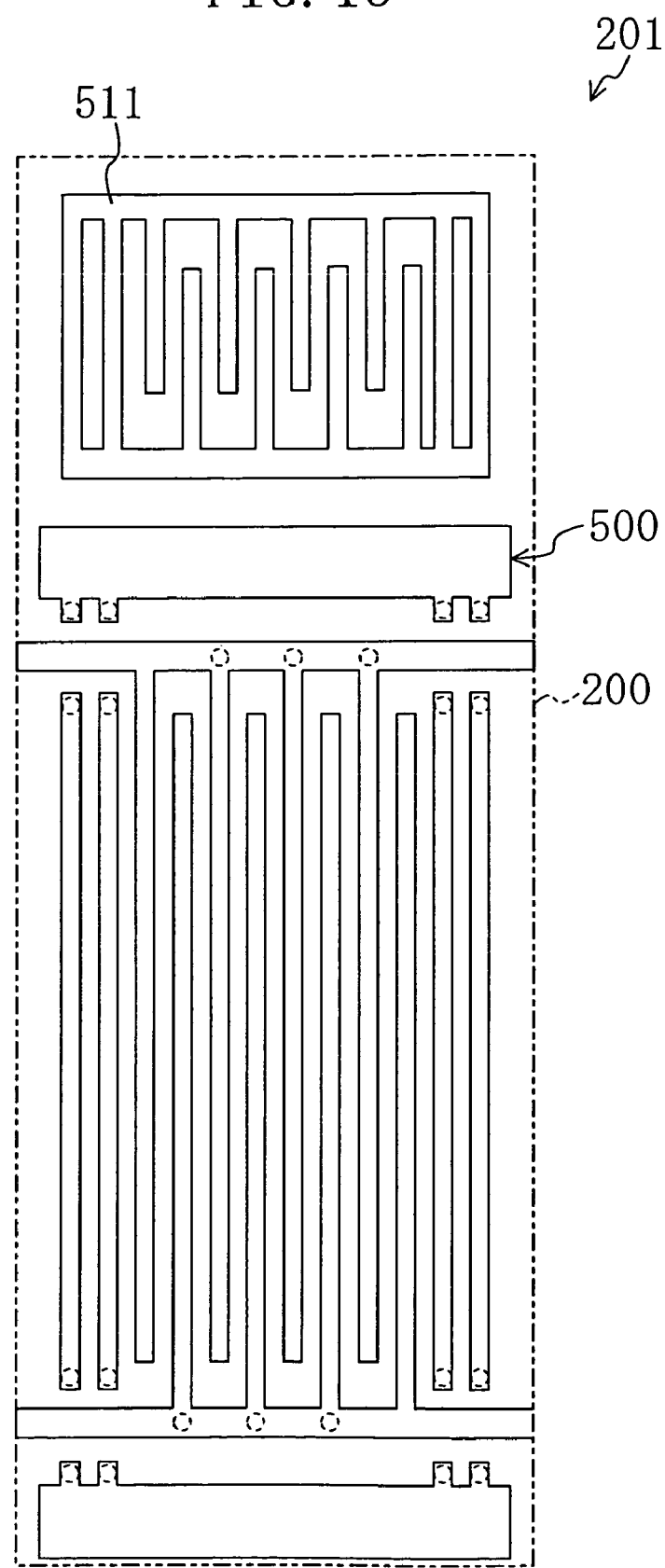
FIG. 13 is still another horizontal cross-section illustrating the unit capacitor according to Embodiment 2.

FIGS. 11-13 show that the M2 layer 400 and the M3 layer 500 include dummy lines 411 and 511 extending lateral to the shields 403 and 404, and 503 and 504, respectively. These dummy lines 411 and 511 include portions which have the same width and pitch as the parallel portions 401a and 402a of the comb-shaped electrodes 401 and 402. This structure suppresses variations in the etching degree in a manufacturing process. Therefore, it is possible to easily increase the form accuracy in the parallel portions 401a and 402a, and accordingly, the accuracy in A/D conversion.

On the semiconductor substrate 200, the R-2R resistance array 102 and the control circuit 106, for example, are formed in a region which extends under the dummy lines 411 and 511 (or in a region including at least a part of the region which extends under the dummy lines 411 and 511). This makes it easy to further reduce the area consumed by the analog-digital converter over the semiconductor substrate.

The M2 layer 400 and the M3 layer 500 may include not only the dummy lines 411 and 511 but also an interconnection pattern 412 connected to the switch line 302 via the contact 409, for example, as shown in FIG. 12. This interconnection pattern 412 as well as the M1 layer 300 may be used as a line for the control circuit 106. Also in such case where the interconnection pattern 412 is formed, keeping a constant line width and pitch enables an easy configuration of the control circuit 106 with high A/D conversion accuracy. Note that, the dummy lines 411 and 511 themselves may be used as interconnection patterns.

Embodiment 3

As described in Embodiment 1, the M1 layer 300 is suitable to be used as the shields 313 and 323, because the use of the M1 layer 300 as the shields 313 and 323 easily reduces the effects of switching noise of the transistors 104a and 104b. However, the invention is not limited to this. The M1 layer 300 may also be used as an electrode of a capacitor in order to decrease the area or to increase the capacitance.

Figure 14:
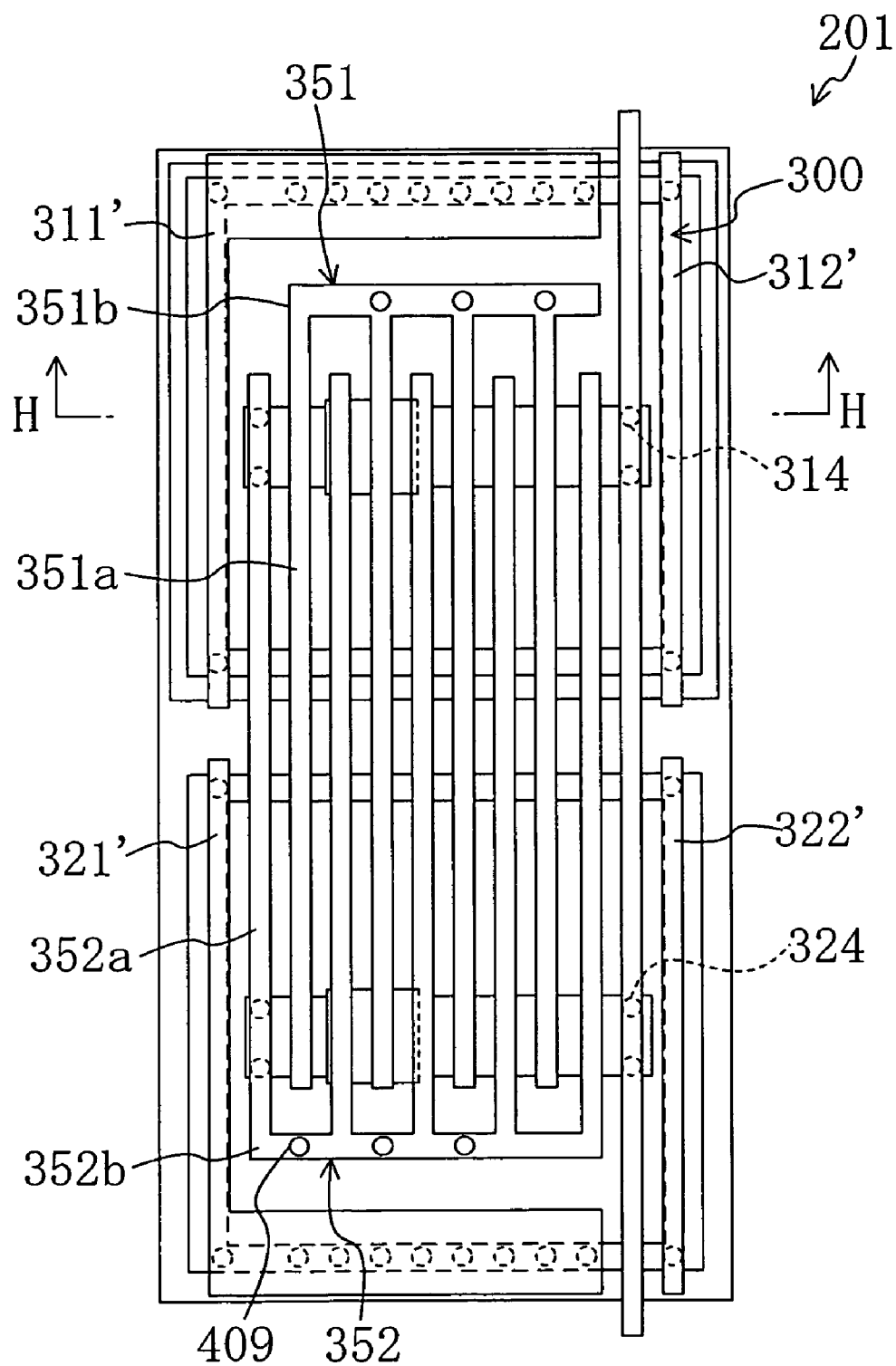
FIG. 14 is a horizontal cross-section illustrating a configuration of a unit capacitor according to Embodiment 3.
Figure 15:
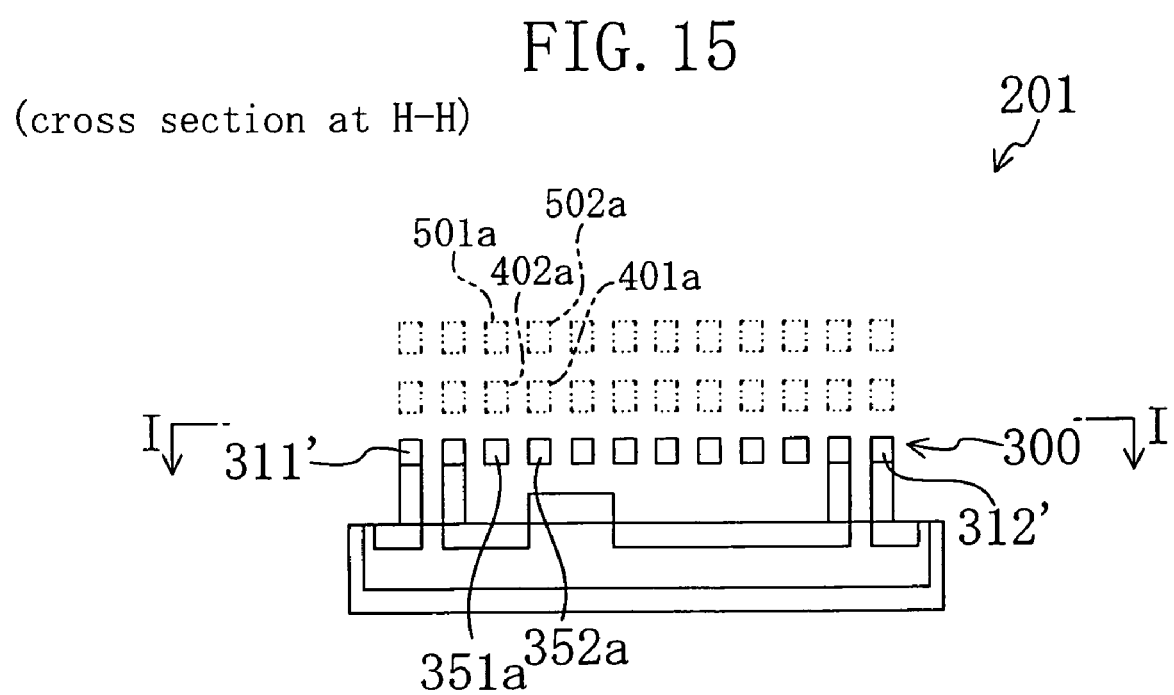
FIG. 15 is a vertical cross-section illustrating the unit capacitor in FIG. 14.

Specifically, in an example shown in FIG. 14 and FIG. 15, comb-shaped electrodes 351 and 352 are formed of the M1 layer 300. Similar to the comb-shaped electrodes 501 and 502, the comb-shaped electrodes 351 and 352 have parallel portions 351a and 352a and connection portions 351b and 352b. The comb-shaped electrodes 351 and 352 are respectively connected to the comb-shaped electrodes 401 and 402 of the M2 layer 400 via the contacts 409. The comb-shaped electrode 351 is formed such that the comb shaped electrode 402 extends over the comb-shaped electrode 351. The comb-shaped electrode 352 is formed such that the comb shaped electrode 401 extends over the comb-shaped electrode 352. One of the parallel portions 352a also serves as a switch line connecting the source region of one of the transistor 104a and 104b to the drain region of the other one of the transistor 104a and 104b via contacts 314 and 324.

Forming the comb-shaped electrodes 351 and 352 as mentioned above makes it possible to increase the capacitance of the unit capacitor 201 by a capacitance between the comb-shaped electrodes 351 and 352 and by capacitances between the comb-shaped electrode 351 and the comb-shaped electrode 401 and between the comb-shaped electrode 352 and the comb-shaped electrode 402, or possible to decrease the area of the unit capacitor 201.

In the example in FIG. 14 and FIG. 15, power supply lines 311', 312', 321', and 322' have the same line width and pitch as the parallel portions 351a and 352a of the comb-shaped electrodes 351 and 352. Such power supply lines 311', 312', 321', and 322' make it possible to easily increase the form accuracy in the parallel portions 351a and 352a as described for the comb-shaped electrodes 401 and 402 in Embodiment 2.

Embodiment 4

Figure 16:
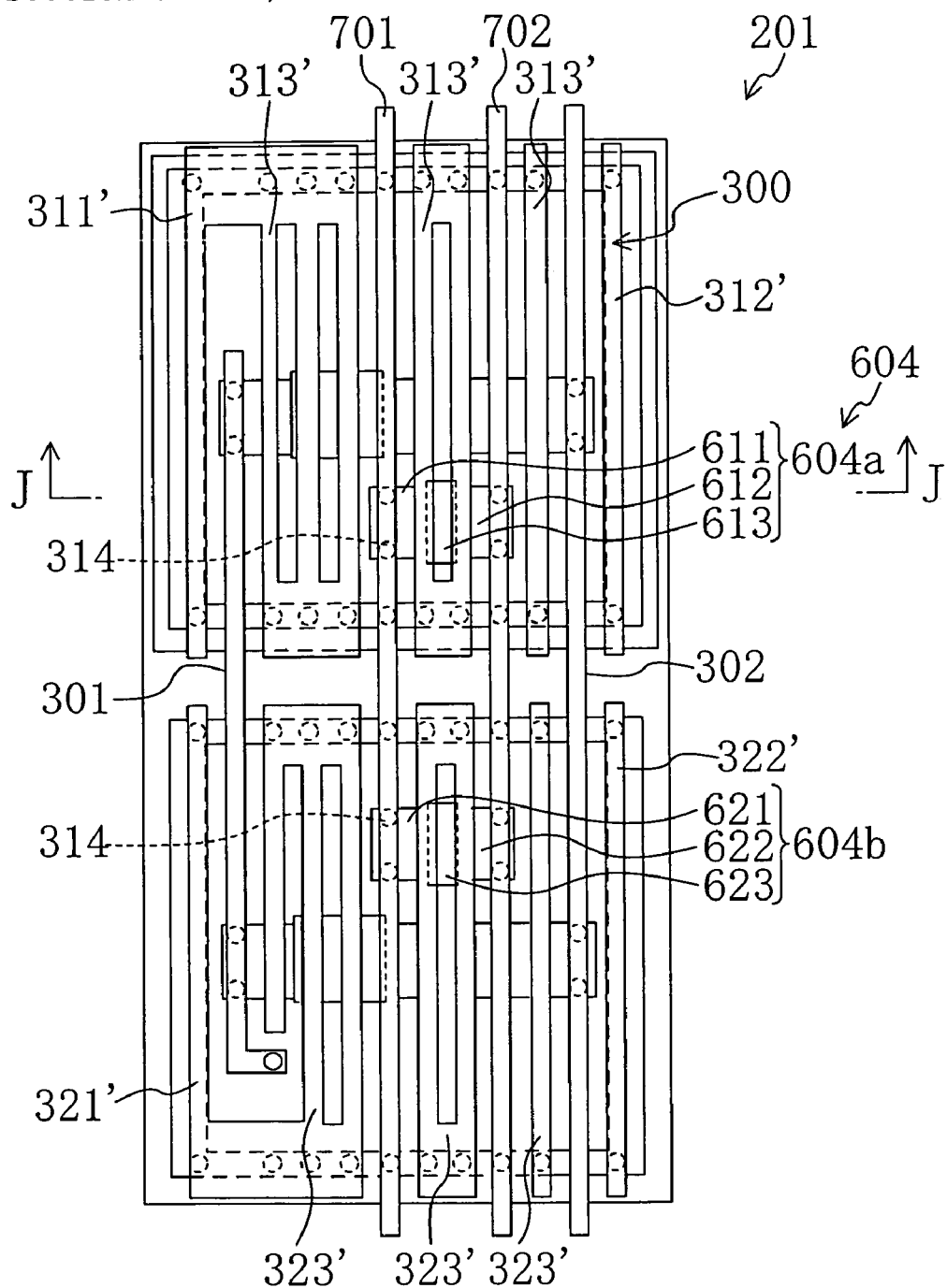
FIG. 16 is a horizontal cross-section illustrating a configuration of a unit capacitor according to Embodiment 4.
Figure 17:
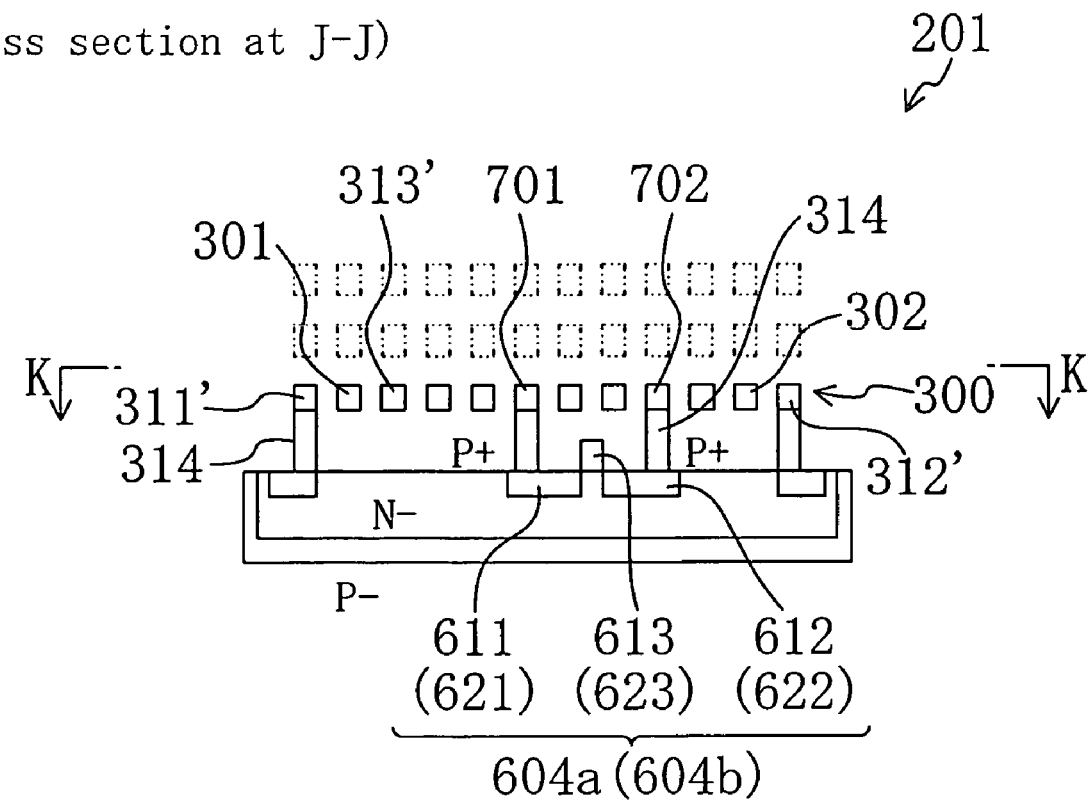
FIG. 17 is a vertical cross-section illustrating the unit capacitor in FIG. 16.
Figure 18:
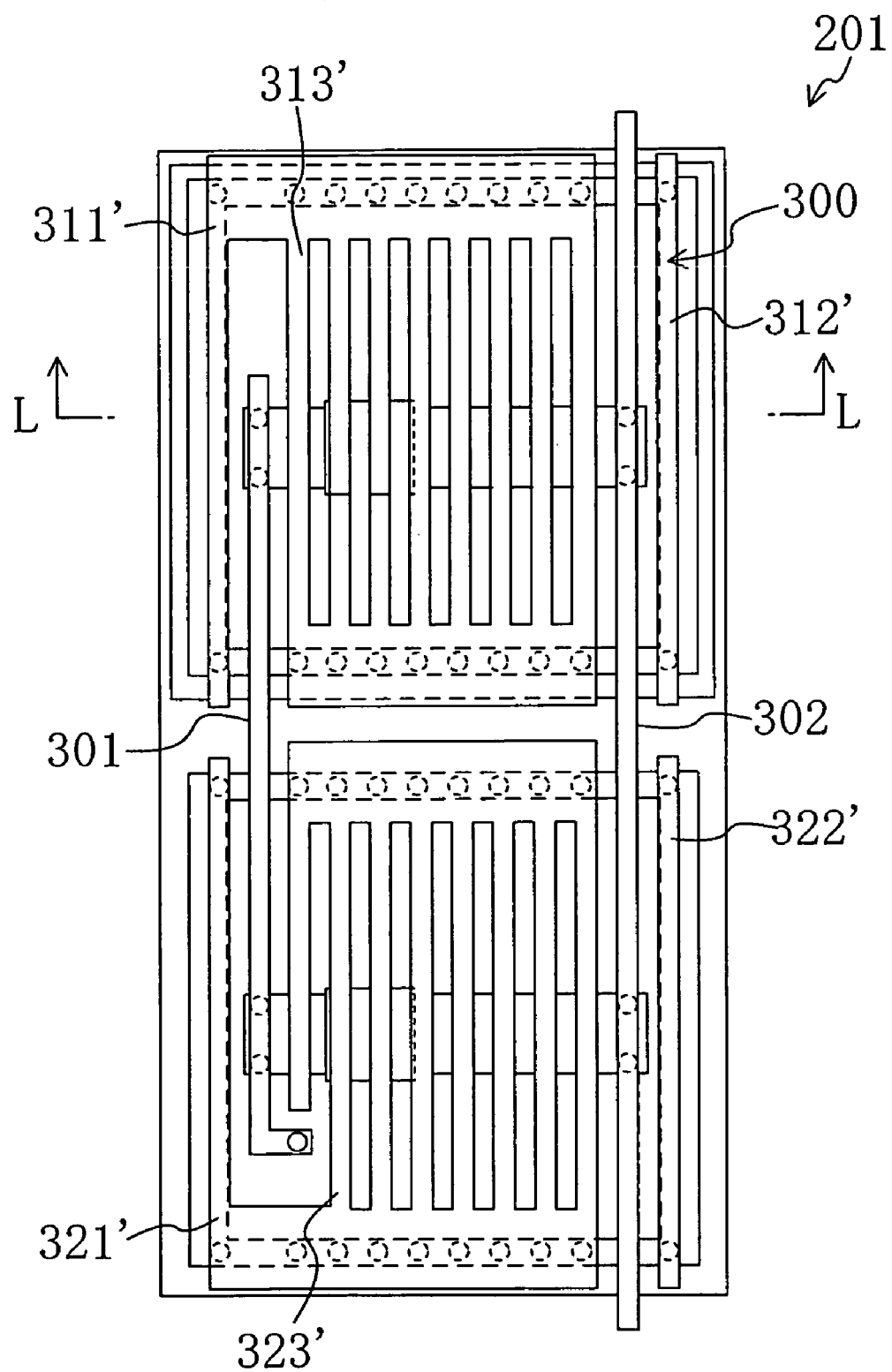
FIG. 18 is a horizontal cross-section illustrating a configuration of a unit capacitor according to Embodiment 5.
Figure 19:
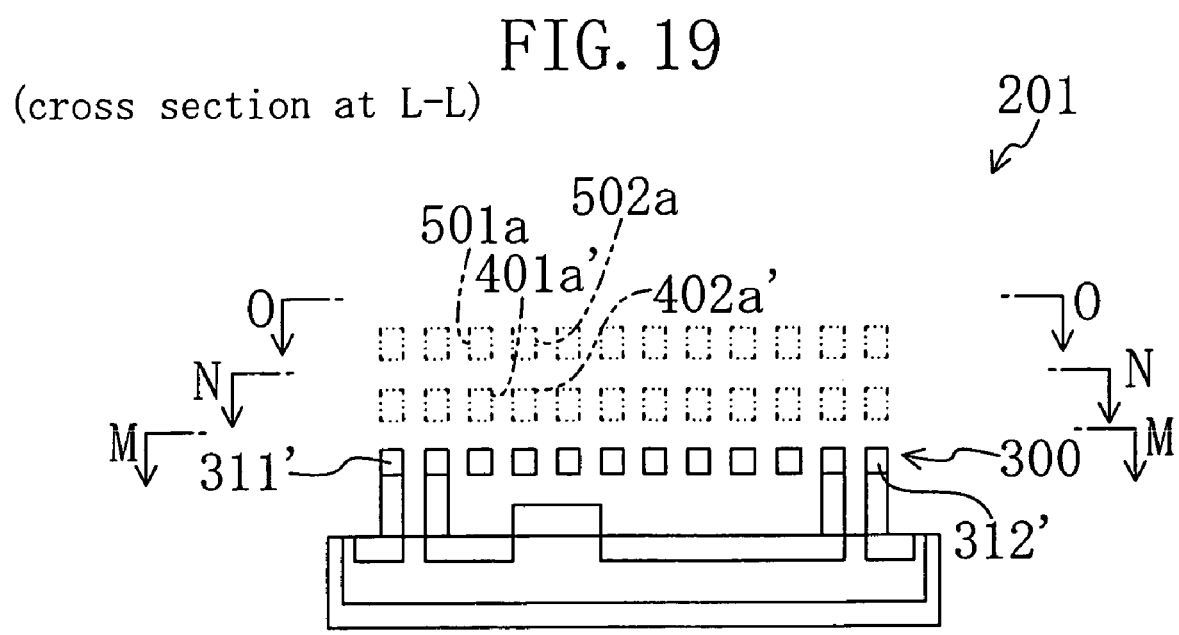
FIG. 19 is a vertical cross-section illustrating the unit capacitor in FIG. 18.
Figure 20:
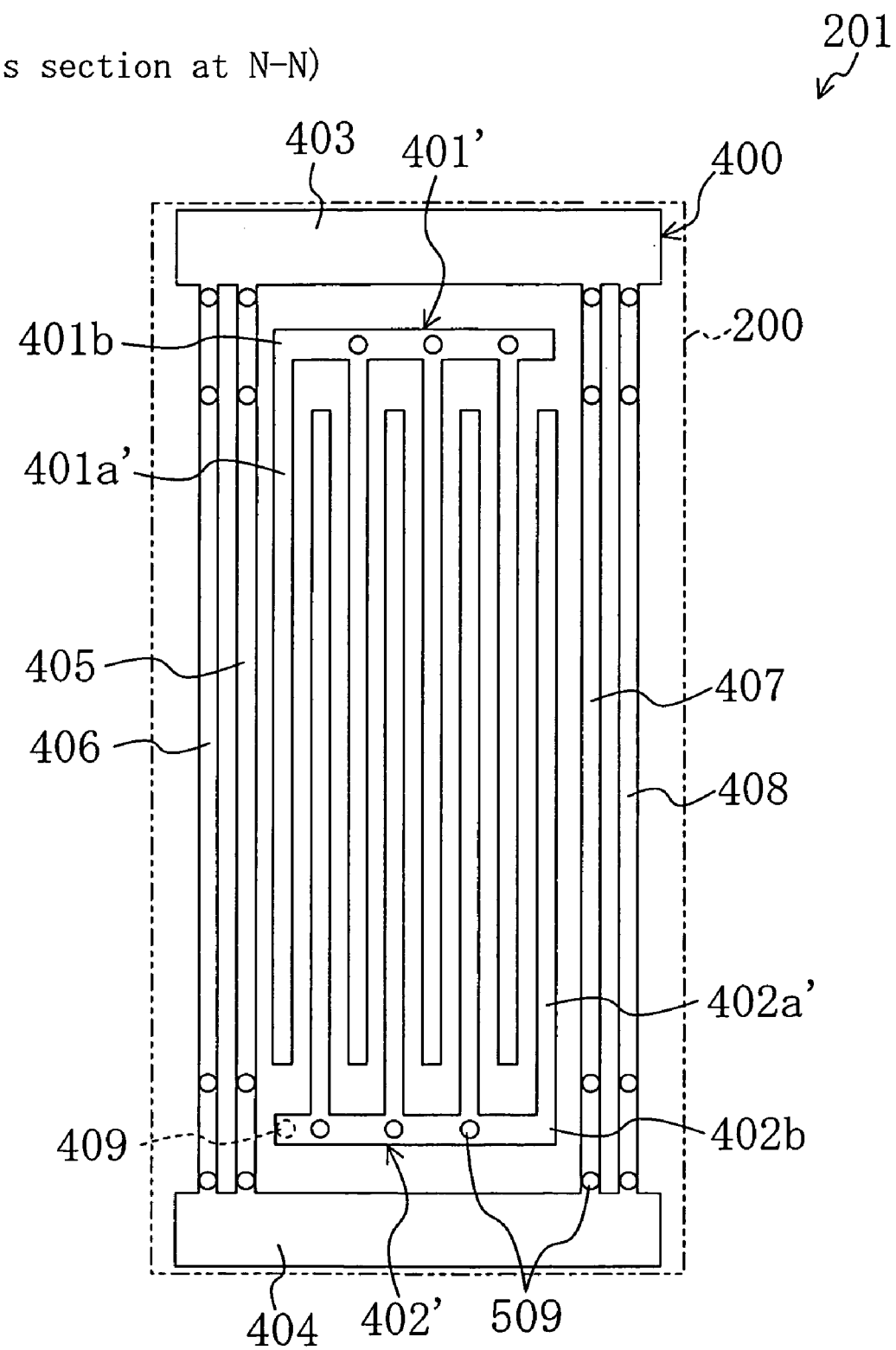
FIG. 20 is another horizontal cross-section illustrating the unit capacitor according to Embodiment 5.
Figure 21:
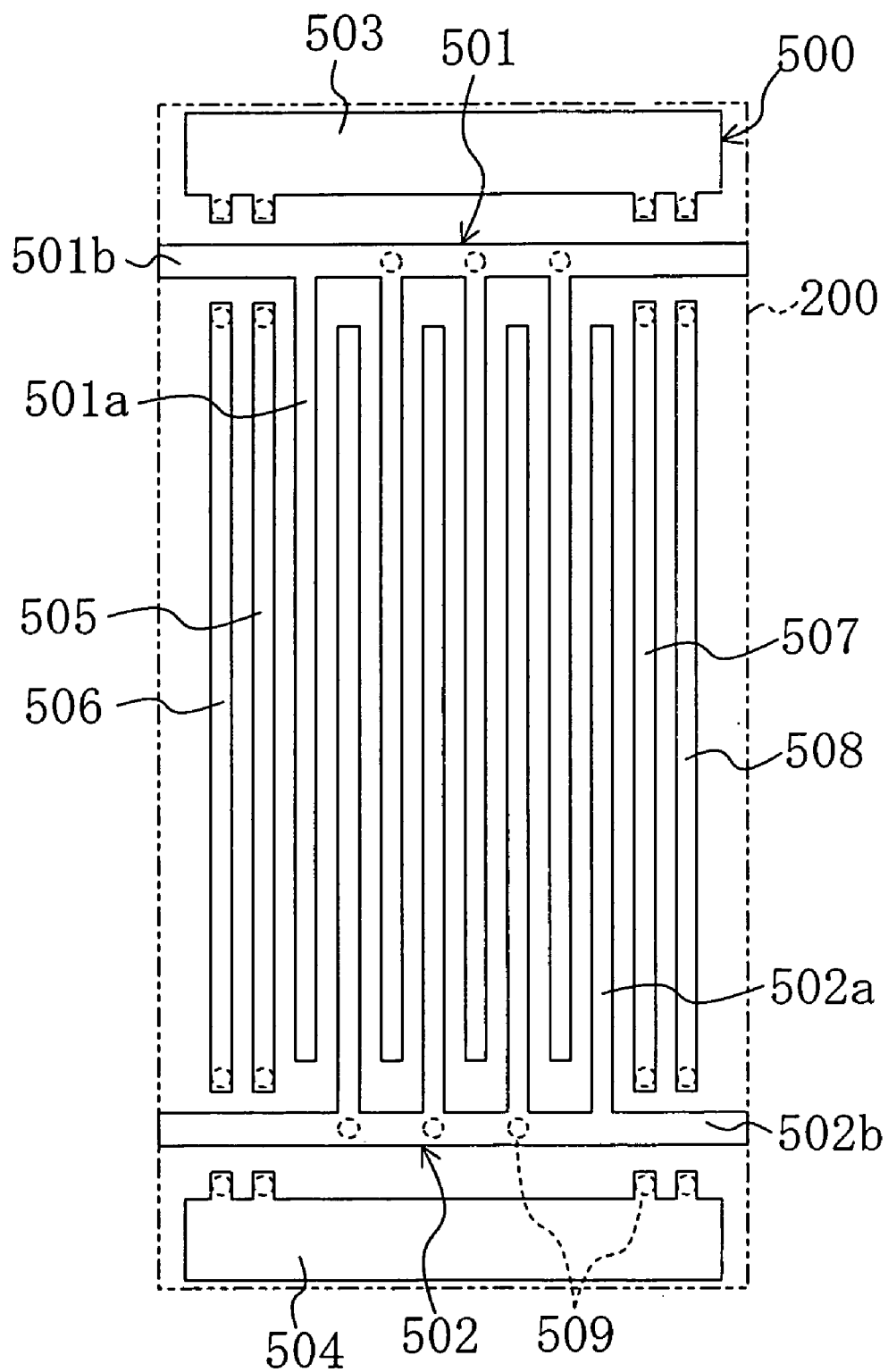
FIG. 21 is still another horizontal cross-section illustrating the unit capacitor according to Embodiment 5.

A transistor to be formed on the semiconductor substrate 200 is not limited to one analog switch 104. One or more analog switches 604, one or more separate transistors, or the like, may be formed such that various circuits are configured. For example, as shown in FIG. 16 and FIG. 17, $P^+$ regions 611 and 612 (source and drain) and a polysilicon gate 613 are formed in the N-well 210, which forms a P-channel transistor 604a. Likewise, $N^+$ regions 621 and 622 (source and drain) and a polysilicon gate 623 (gate) are directly formed in the semiconductor substrate 200, which forms an N-channel transistor 604b.

The M1 layer 300 includes switch lines 701 and 702. The switch line 701 connects the $P^+$ region 611 and the $N^+$ region 621 of the transistors 604a and 604b and a circuit provided outside the unit capacitor 201. The switch line 702 connects the $P^+$ region 612 and the $N^+$ region 622 of the transistors 604a and 604b and a circuit provided outside the unit capacitor 201.

The M1 layer 300 may further include shields 313' and 323'. The shield 313' and 323' may be formed in a planar form in a region excluding the switch lines 701 and 702. However, forming the power supply lines 311', 312', 321', and 322', the shields 313' and 323', and switch lines 301, 302, 701, and 702 to have the same line width and pitch as the parallel portion 401a of the comb-shaped electrode 401, as shown in FIG. 16 and FIG. 17, increases the similarity of the interconnection pattern of the M1 layer 300 and the M2 layer 400, which makes it possible to easily increase the form accuracy, for example, in the parallel portion 401a of the comb-shaped electrode 401.

Embodiment 5

In the example described in Embodiment 1, the parallel portion 502a of the comb-shaped electrode 502 extending over the parallel portion 401a of the comb-shaped electrode 401, and the parallel portion 501a of the comb-shaped electrode 501 extending over the parallel portion 402a of the comb-shaped electrode 402 have capacitance also in a direction vertical to the semiconductor substrate 200. However, an arrangement which has capacitance only in a direction parallel to the semiconductor substrate 200 is also possible. Specifically, as shown in FIGS. 18-21, comb-shaped electrodes 401' and 402' of the M2 layer 400 are formed such that comb-shaped electrodes 501 and 502 of the M3 layer 500 respectively extend over the comb-shaped electrodes 401' and 402'.

In this arrangement, a capacitance is only between parallel portions 401a' and 402a' and between the parallel portions 501a and 502a. Therefore, a total capacitance is decreased, when the area of the interconnection pattern remains unchanged. However, even in a case where an offset occurs between a mask for patterning the M2 layer 400 and a mask for patterning the M3 layer 500 in a manufacturing process, the offset does not change the capacitance. Therefore, increasing the capacitance accuracy makes it possible to easily increase analog-digital conversion accuracy.

Figure 4:
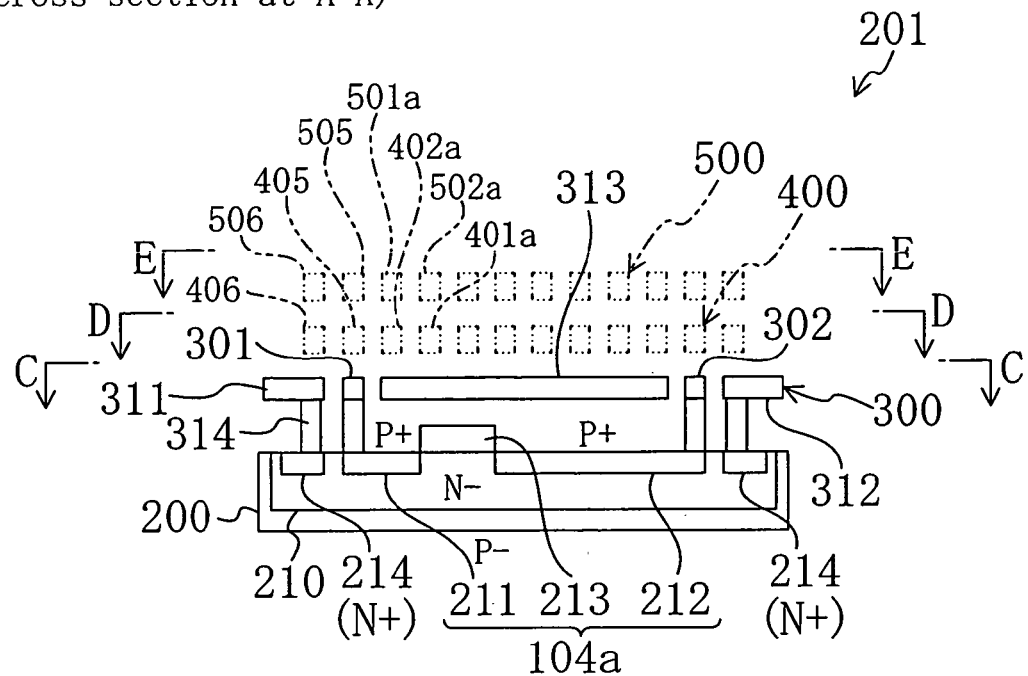
FIG. 4 is a vertical cross-section illustrating the unit capacitor in FIG. 3.
Figure 5:
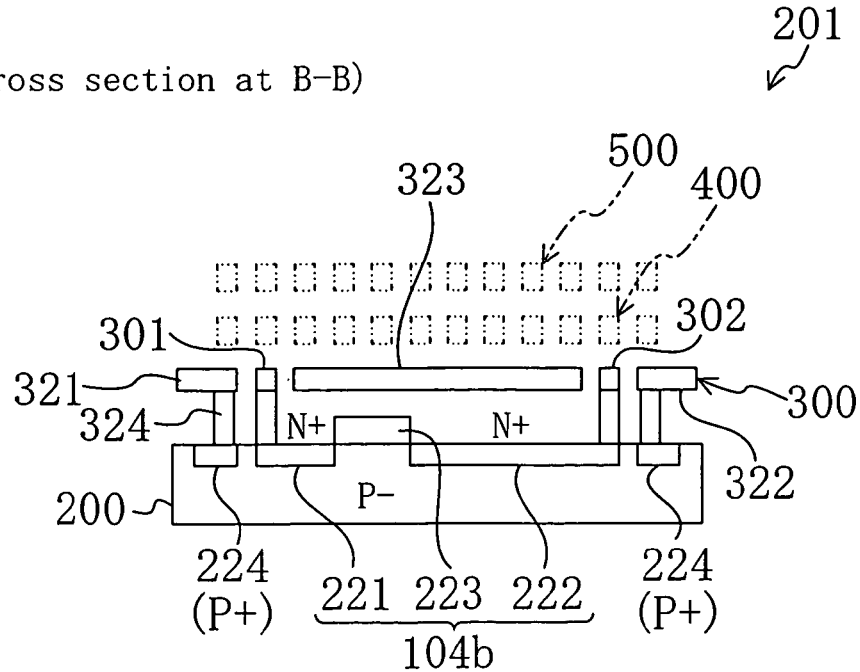
FIG. 5 is another vertical cross-section illustrating the unit capacitor in FIG. 3.
Figure 9:
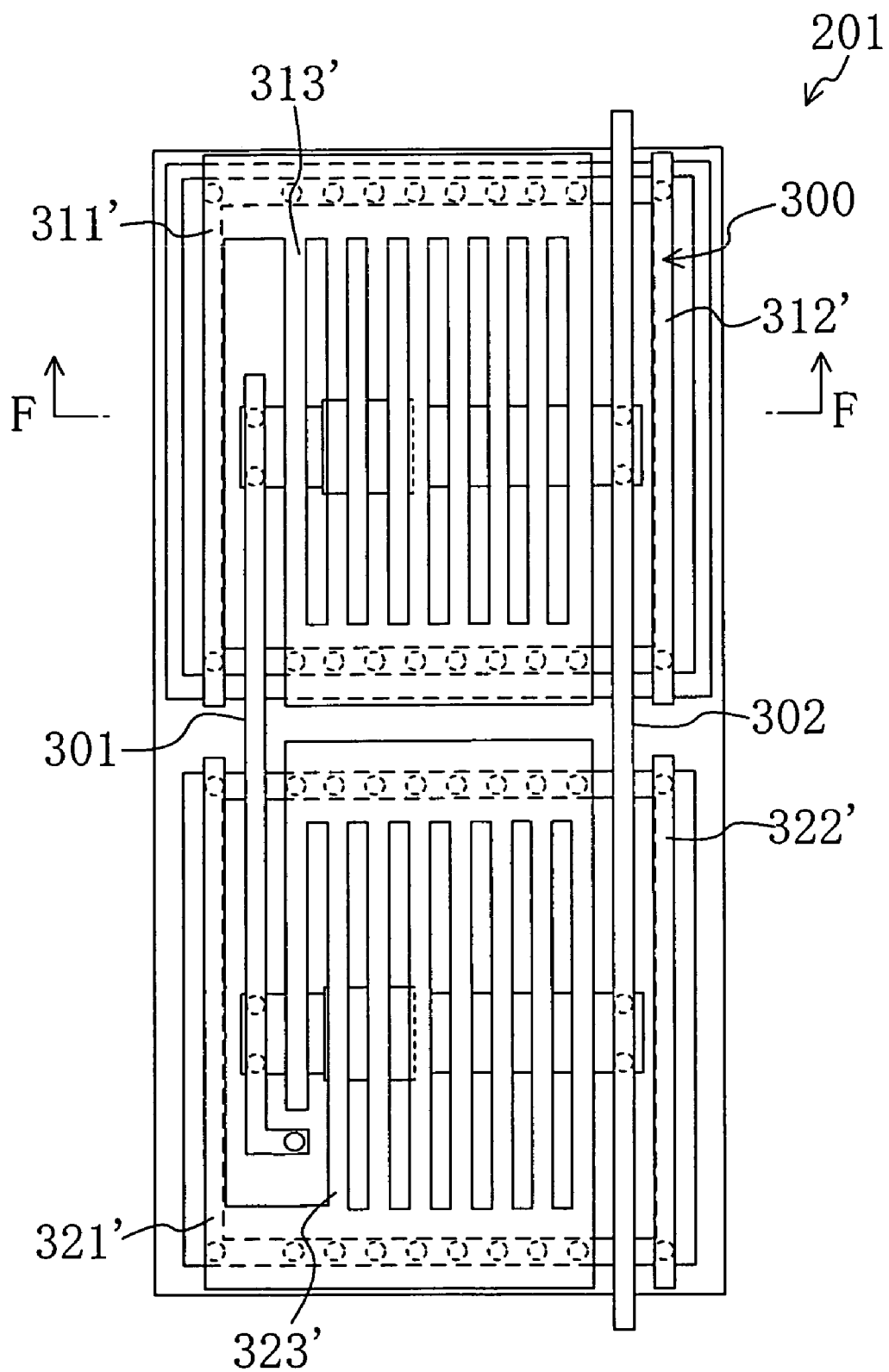
FIG. 9 is a horizontal cross-section illustrating a configuration of a unit capacitor according to a variation.
Figure 10:
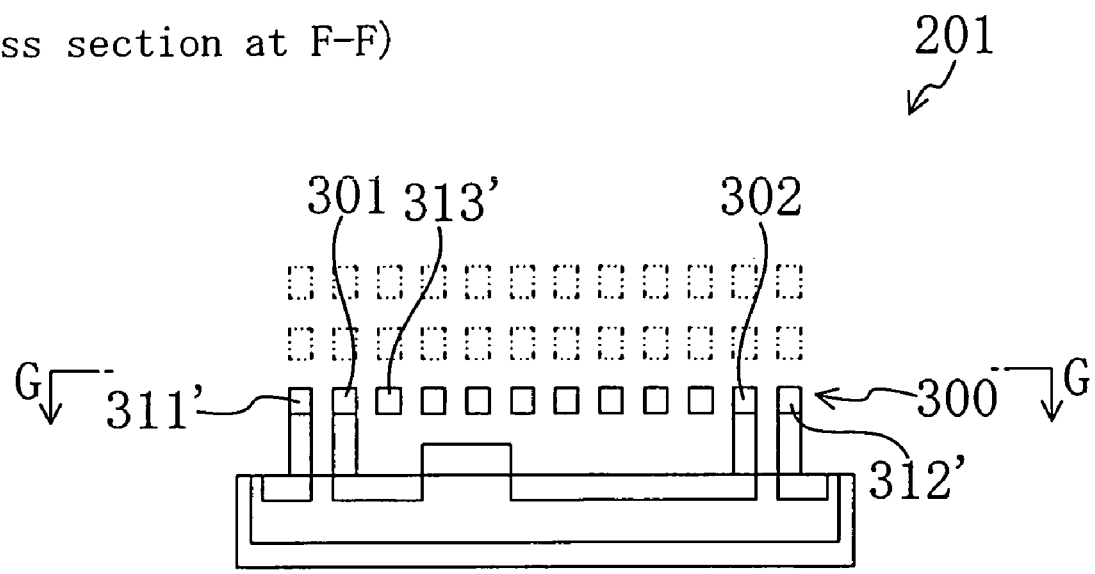
FIG. 10 is a vertical cross-section illustrating the unit capacitor in FIG. 9.

In the example shown in FIGS. 18-21, shields 313' and 323' have the same pitch as, for example, the parallel portion 401a' of the comb-shaped electrode 401' as described in the variation of Embodiment 1 (FIG. 9 and FIG. 10). However, the shields 313' and 323' may be formed in a planar form as shown in Embodiment 1 (FIGS. 3-5).

Embodiment 6

(Another Layout of Unit Capacitor 201 and Relevant Components)

The array of the unit capacitors 201 is not limited to that of Embodiment 1 where the unit capacitors are aligned in a line on the semiconductor substrate. The unit capacitors 201 may be aligned in two lines as shown in, for example, FIG. 22.

A total of 36 unit capacitors 201 are aligned in two lines adjacent to each other. The unit capacitors 201 are organized into groups of 16, 8, 4, and 2 unit capacitors, and the unit capacitors 201 in each group are connected with each other, forming capacitors 16C, 8C, 4C, and 2C (the order of array of these capacitors is not limited to this). More specifically, a capacitor 16C, for example, has eight unit capacitors 201 each aligned with line symmetry. The connection portions 502b of the comb-shaped electrodes 502 are connected with each other within the group of unit capacitors 201, while connection portions 501b of the comb-shaped electrodes 501 of all the unit capacitors 201 are connected with each other, which forms a common line (com_Lin) in the vicinity of the outer circumference of the unit capacitors 201. The common line surrounds the whole unit capacitor 201 and has a horizontally inverted C-shape.

As in Embodiment 1, this array makes it possible to easily reduce the area required for the formation of the capacitor and the analog switch. In this array, it is avoided that connection lines between the source regions or the drain regions of the transistors 104a and 104b and the comb-shaped electrodes 402 and 502 cross over the common line and that the lines connecting the connection portions 502b of the unit capacitors 201 in each group with each other cross over the common line. Consequently, occurrences of parasitic capacitance and cross talk are suppressed. Therefore, it is possible to easily perform a highly accurate analog-digital conversion.

Embodiment 7

(Layout on LSI Chip)

A layout showing where on an LSI chip the analog-digital converter 100 as described in Embodiments 1 and 6 is positioned is not specifically limited. Layout examples will be explained as follows.

Figure 23:
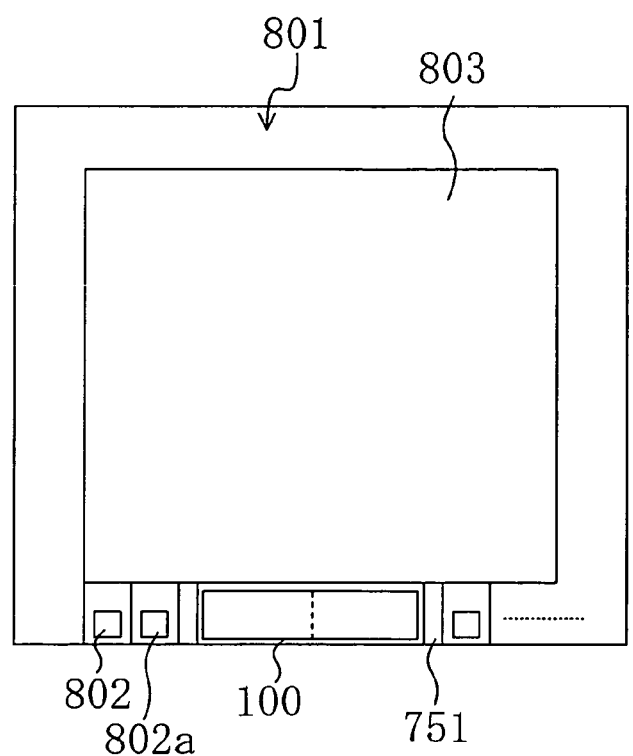
FIG. 23 is a plan view illustrating a position of an analog-digital converter according to Embodiment 7 over an LSI chip.

It is relatively easy for the unit capacitors 201 aligned in one line as in Embodiment 1 to limit the width of the analog-digital converter 100 to small. Therefore, as shown, for example, in FIG. 23, the analog-digital converter 100 may have substantially the same width as input/output cells 802 (each of which is provided with a terminal pads 802a) to be provided around a periphery of an LSI chip 801, and the analog-digital converter 100 and the input/output cells 802 may be positioned side by side. In a case where a margin (dead space) exists in a terminal pad area, this array advantageously uses the terminal pad area, so that it is possible to easily reduce the LSI chip area.

Figure 24:
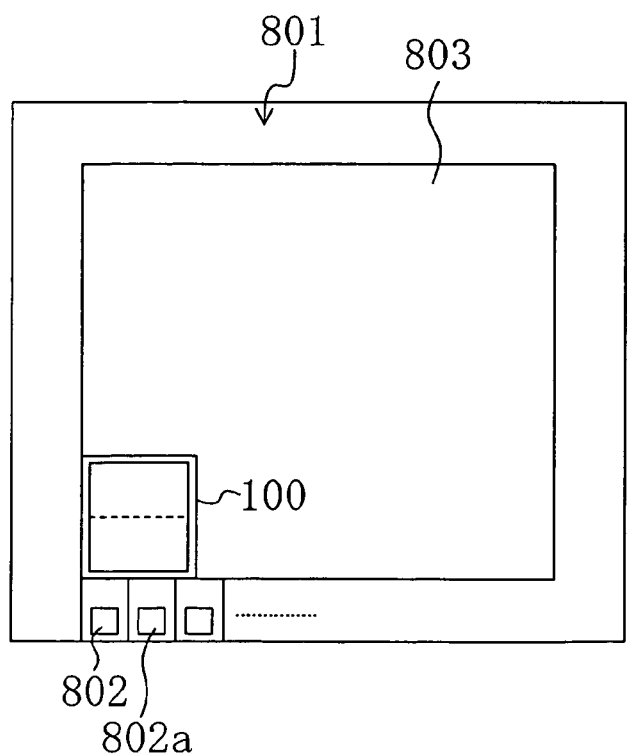
FIG. 24 is a plan view illustrating another position of the analog-digital converter according to Embodiment 7.

Meanwhile, in a case where the unit capacitors 201 are aligned in two lines as shown in Embodiment 6, the analog-digital converter 100 may be positioned in an inner region 803 of the LSI chip 801 as shown in, for example, FIG. 24.

Embodiment 8

(Design Method of Analog-Digital Converter)

Figure 22:
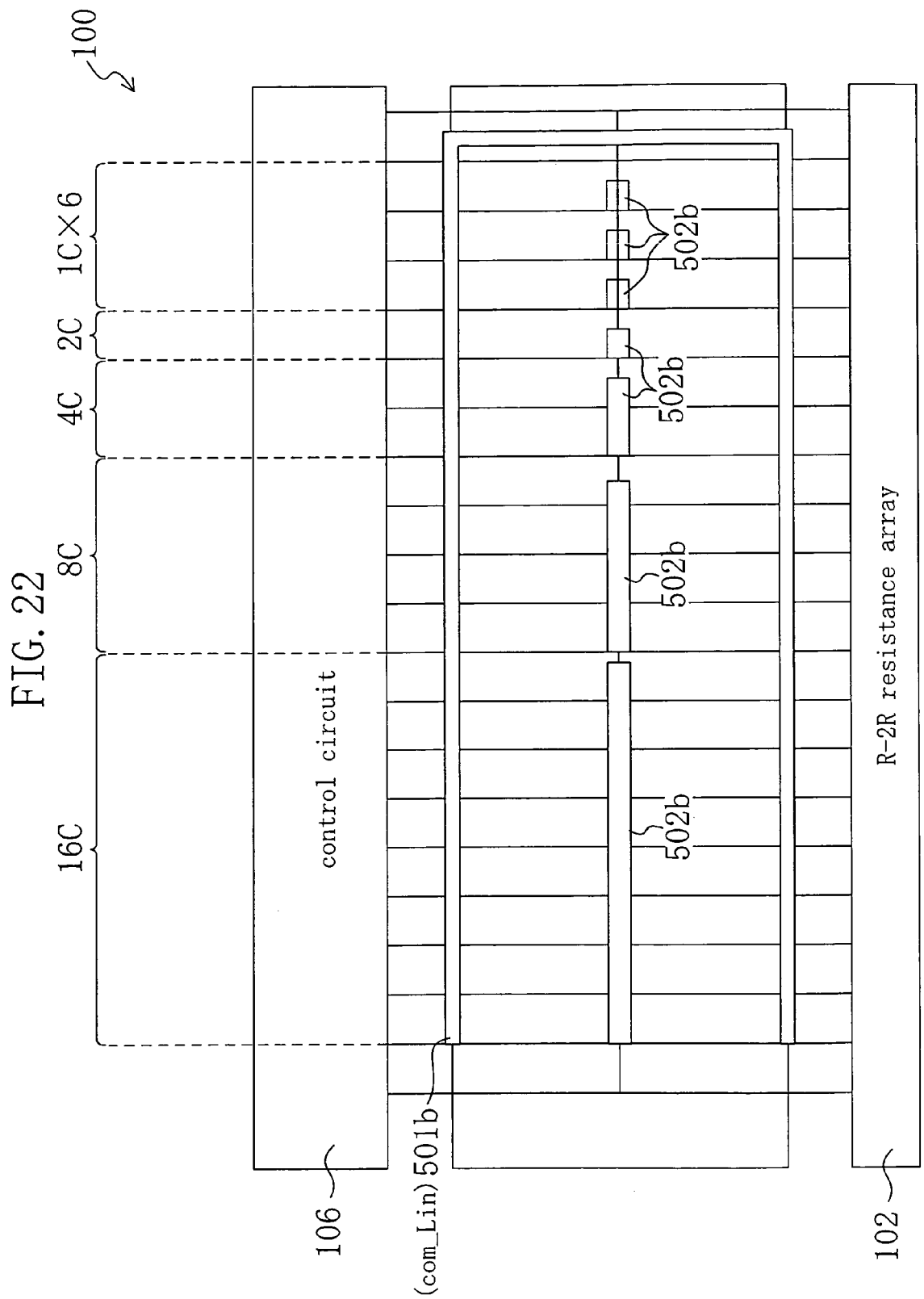
FIG. 22 is a plan view illustrating a circuit array of an analog-digital converter according to Embodiment 6.

A predetermined number of unit capacitors 201 are aligned as described in Embodiment 1 (FIG. 8) and Embodiment 6 (FIG. 22). This makes it possible to realize a combination of analog switches and capacitors having various capacitances. Now, the unit capacitors 201 are registered as cells in a library, and array data showing the cells aligned side by side is generated. This achieves, a small LSI chip area, high accuracy in the capacitance ratio, and reduced effects of cross-talk. As mentioned above, it is therefore possible to easily design an analog-digital converter having a stable quality and high analog-digital conversion accuracy with a reduced worker-hour.

Moreover, registering many types of unit capacitors 201 having variety of accuracy levels, sizes, areas, and the like in the library enables an analog-digital converter to be designed easily and changed its design according to requested specifications. Moreover, only providing a predetermined number of unit capacitors 201 makes it possible to design an analog-digital converter having variety of conversion bit length such as 8 bits and 10 bits.

OTHER EMBODIMENTS

As well as the unit capacitors 201, a unit capacitor having a capacitive element but no analog switch 104 may be used to form an analog-digital converter. That is, in a case where analog switches 104 of one or some unit capacitors 201 suffice a necessary number of analog switches, analog switches 104 are not necessarily provided for the other unit capacitors. Moreover, even if an analog switch 104 is provided, the analog switch 104 may not be used in practice. An analog switch 104 provided may be used for the other circuits.

Figure 25:
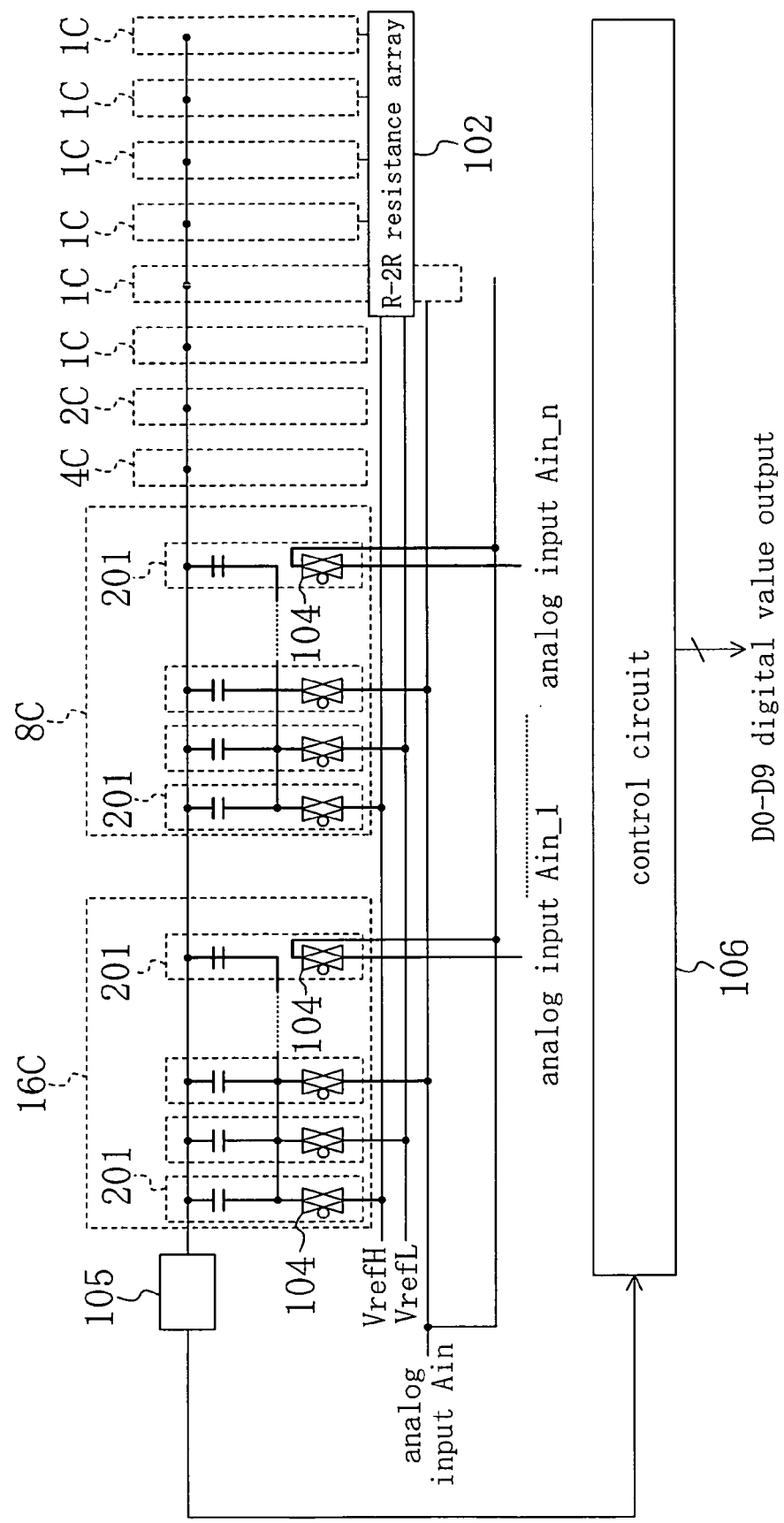
FIG. 25 is a circuit diagram illustrating a circuit configuration of an analog-digital converter according to a variation.

In an example shown in FIG. 25, analog switches 104 each provided in three unit capacitors 201 in the capacitors 16C and 8C are used for selecting one of the reference voltages VrefH and VrefL, while other analog switches 104 provided in further n unit capacitors 201 are used for selecting one of n analog input voltages Ain_1 to Ain_n. This makes it possible to obtain, for example, an analog-digital converter in which voltages input via a plurality of analog input voltage terminals are switched by an analog selector without additionally providing an analog switch outside the unit capacitor 201.

What is claimed is:

1. An analog-digital converter, comprising:
   an analog switch on a semiconductor substrate, the analog switch having a P-channel transistor and an N-channel transistor; and
   a capacitive element having a first electrode and a second electrode, wherein
   a source region of the P-channel transistor is connected to a drain region of the N-channel transistor, a source region of the N-channel transistor is connected to a drain region of the P-channel transistor, and the first electrode of the capacitive element is connected to one of connected portions of the regions, and
   the first electrode and the second electrode are included in a region in a layer different from a layer of the analog switch, the region extending over the analog switch, and the first electrode and the second electrode have a comb-shaped pattern different from an arrangement pattern of the source regions and the drain regions of the P-channel transistor and the N-channel transistor.

2. An analog-digital converter set forth in claim 1, further comprising a shield layer between a layer including the first and second electrodes and the analog switch.

3. An analog-digital converter set forth in claim 2, wherein the shield layer has a portion which has the same pitch and width as the first and second electrodes.

4. An analog-digital converter set forth in claim 1, further comprising a shield line in a region in the layer of the first electrode and the second electrode, the region extending over the source region and drain region.

5. An analog-digital converter set forth in claim 4, wherein the shield line includes a portion which has the same pitch and width as an adjacent portion of the first electrode or the second electrode.

6. An analog-digital converter set forth in claim 5, further comprising another shield line having a portion which has said pitch and width and which extends lateral to the shield line.

7. An analog-digital converter set forth in claim 1, further comprising:
   a peripheral line including a portion which has the same pitch and width as the first and second electrodes at a periphery of the first electrode and the second electrode; and
   a semiconductor element in a region extending under or over the peripheral line, the region being at a periphery of the analog switch.

8. An analog-digital converter set forth in claim 1, wherein the capacitive element further includes a third electrode and a fourth electrode respectively connected to the first electrode and the second electrode, and
   the third electrode and the fourth electrode are provided between a layer including the first and second electrodes and the analog switch.

9. An analog-digital converter set forth in claim 8, wherein the third electrode extends over or under the first electrode, and the fourth electrode extends over or under the second electrode.

10. An analog-digital converter set forth in claim 8, wherein the fourth electrode extends over or under the first electrode, and the third electrode extends over or under the second electrode.

11. An analog-digital converter set forth in claim 1, further comprising another analog switch in a region extending over the first and the second electrode at a periphery of the analog switch.

12. A method for designing an analog-digital converter, comprising configuring a capacitive element to have a predetermined capacitance by arraying a plurality of unit capacitive element cells, each of the unit capacitive element cells including
   an analog switch on a semiconductor substrate, the analog switch having a P-channel transistor and an N-channel transistor; and
   a capacitive element having a first electrode and a second electrode, wherein
   a source region of the P-channel transistor is connected to a drain region of the N-channel transistor, a source region of the N-channel transistor is connected to a drain region of the P-channel transistor, and the first electrode of the capacitive element is connected to one of connected portions of the regions, and
   the first electrode and the second electrode are included in a region in a layer different from a layer of the analog switch, the region extending over the analog switch, and the first electrode and the second electrode have a comb-shaped pattern different from an arrangement pattern of the source regions and the drain regions of the P-channel transistor and the N-channel transistor.

13. An analog-digital converter set forth in claim 1, wherein the first electrode and the second electrode are included in the region, in the layer above the layer of the analog switch.

14. A method for designing an analog-digital converter set forth in claim 12, wherein the first electrode and the second electrode are included in the region, in the layer above the layer of the analog switch.

* * * * *